(12) United States Patent
O'Halloran et al.

(10) Patent No.: US 11,867,787 B2
(45) Date of Patent: Jan. 9, 2024

(54) CORRECTING FOR HYSTERESIS IN MAGNETIC RESONANCE IMAGING

(71) Applicant: Hyperfine Operations, Inc., Guilford, CT (US)

(72) Inventors: Rafael O'Halloran, Guilford, CT (US); Cedric Hugon, Guilford, CT (US); Laura Sacolick, Guilford, CT (US); Hadrien A. Dyvorne, New York, NY (US)

(73) Assignee: Hyperfine Operations, Inc., Guilford, CT (US)

( * ) Notice: Subject to any disclaimer, the term of this patent is extended or adjusted under 35 U.S.C. 154(b) by 0 days.

(21) Appl. No.: 16/684,976

(22) Filed: Nov. 15, 2019

(65) Prior Publication Data
US 2020/0209334 A1 Jul. 2, 2020

Related U.S. Application Data

(60) Provisional application No. 62/786,265, filed on Dec. 28, 2018.

(51) Int. Cl.
*G01R 33/565* (2006.01)
*G01R 33/32* (2006.01)
(Continued)

(52) U.S. Cl.
CPC ....... *G01R 33/56572* (2013.01); *G01R 33/32* (2013.01); *G01R 33/543* (2013.01); *G01R 33/5608* (2013.01); *G01R 33/56518* (2013.01)

(58) Field of Classification Search
CPC .............. G01R 33/5608; G01R 33/543; G01R 33/546; G01R 33/5635; G01R 33/56509;
(Continued)

(56) References Cited

U.S. PATENT DOCUMENTS 4,980,641 A 12/1990 Breneman et al.
5,126,672 A 6/1992 Le Roux
(Continued)

FOREIGN PATENT DOCUMENTS

CN 1258001 A 6/2000
CN 1336558 A 2/2002
(Continued)

OTHER PUBLICATIONS

Novak, Miroslav, Jakub Eichler, and Miloslav Kosek. "Difficulty in identification of Preisach hysteresis model weighting function using first order reversal curves method in soft magnetic materials." Applied Mathematics and Computation 319 (May 15, 2017): 469-485. (Year: 2017).*
(Continued)

*Primary Examiner* — Rishi R Patel
(74) *Attorney, Agent, or Firm* — Foley & Lardner LLP

(57) ABSTRACT

An apparatus for controlling at least one gradient coil of a magnetic resonance imaging (MRI) system. The apparatus may include at least one computer hardware processor; and at least one computer-readable storage medium storing processor executable instructions that, when executed by the at least one computer hardware processor, cause the at least one computer hardware processor to perform a method. The method may include receiving information specifying at least one target pulse sequence; determining a corrected pulse sequence to control the at least one gradient coil based on the at least one target pulse sequence and a hysteresis model of induced magnetization in the MRI system caused by operation of the at least one gradient coil; and controlling, using the corrected gradient pulse sequence, the at least one gradient coil to generate one or more gradient pulses for imaging a patient.

18 Claims, 25 Drawing Sheets

(51) Int. Cl.
*G01R 33/54* (2006.01)
*G01R 33/56* (2006.01)

(58) Field of Classification Search
CPC ...... G01R 33/561; G01R 33/14; G01R 33/36; G01R 33/56563; G01R 33/445; G01R 33/56572; G01R 33/32; G01R 33/56518; G01R 33/58; G01R 33/3802; G01R 33/3806; G01R 33/389; G01R 33/3852; A61B 5/055; A61B 5/0037; A61B 2576/026
See application file for complete search history.

(56) References Cited

U.S. PATENT DOCUMENTS

| | | | |
|---|---|---|---|
| 5,227,728 A * | 7/1993 | Kaufman | G01R 33/389 324/318 |
| 5,250,901 A * | 10/1993 | Kaufman | G01R 33/3806 324/318 |
| 5,332,969 A | 7/1994 | Tsuruno et al. | |
| 5,652,517 A | 7/1997 | Maki et al. | |
| 5,864,233 A | 1/1999 | Zhou et al. | |
| 6,191,582 B1 | 2/2001 | Zur | |
| 6,201,987 B1 | 3/2001 | Dumoulin | |
| 6,291,997 B1 * | 9/2001 | King | G01R 33/56518 324/319 |
| 6,335,620 B1 | 1/2002 | Weissenberger | |
| 6,392,411 B1 * | 5/2002 | Goto | G01R 33/56518 324/307 |
| 6,437,566 B1 | 8/2002 | Heid | |
| 6,483,305 B1 * | 11/2002 | Miyamoto | G01R 33/56518 324/307 |
| 9,541,616 B2 | 1/2017 | Rothberg et al. | |
| 9,547,057 B2 | 1/2017 | Rearick et al. | |
| 9,625,544 B2 | 4/2017 | Poole et al. | |
| 9,645,210 B2 | 5/2017 | McNulty et al. | |
| 9,817,093 B2 | 11/2017 | Rothberg et al. | |
| 10,145,913 B2 | 12/2018 | Hugon et al. | |
| 10,145,922 B2 | 12/2018 | Rothberg et al. | |
| 10,222,434 B2 | 3/2019 | Poole et al. | |
| 10,274,561 B2 | 4/2019 | Poole et al. | |
| 10,281,540 B2 | 5/2019 | Mileski et al. | |
| 10,281,541 B2 | 5/2019 | Poole et al. | |
| 10,310,037 B2 | 6/2019 | McNulty et al. | |
| 10,416,264 B2 | 9/2019 | Sofka et al. | |
| 10,551,452 B2 | 2/2020 | Rearick et al. | |
| 10,591,561 B2 | 3/2020 | Sacolick et al. | |
| 10,709,387 B2 | 7/2020 | Poole et al. | |
| 11,156,688 B2 | 10/2021 | O'Halloran et al. | |
| 2001/0041819 A1 | 11/2001 | Goto | |
| 2002/0097049 A1 | 7/2002 | Goto | |
| 2004/0046554 A1 | 3/2004 | Carlini | |
| 2006/0192558 A1 * | 8/2006 | Miyawaki | G01R 33/385 324/307 |
| 2010/0148774 A1 | 6/2010 | Kamata | |
| 2012/0098535 A1 | 4/2012 | Kaneta et al. | |
| 2013/0154642 A1 * | 6/2013 | Sueoka | G01R 33/34015 324/309 |
| 2013/0187650 A1 | 7/2013 | Pfeuffer et al. | |
| 2013/0234708 A1 | 9/2013 | Goora et al. | |
| 2014/0125333 A1 | 5/2014 | Hanada et al. | |
| 2014/0218031 A1 | 8/2014 | Lee et al. | |
| 2016/0128592 A1 | 5/2016 | Rosen et al. | |
| 2016/0131727 A1 | 5/2016 | Sacolick et al. | |
| 2016/0245891 A1 | 8/2016 | Ookawa | |
| 2018/0238978 A1 | 8/2018 | McNulty et al. | |
| 2019/0038233 A1 | 2/2019 | Poole et al. | |
| 2019/0324098 A1 | 10/2019 | McNulty et al. | |
| 2019/0353723 A1 | 11/2019 | Dyvorne et al. | |
| 2019/0353726 A1 | 11/2019 | Poole et al. | |
| 2020/0022611 A1 | 1/2020 | Nelson et al. | |
| 2020/0022612 A1 | 1/2020 | McNulty et al. | |
| 2020/0034998 A1 | 1/2020 | Schlemper et al. | |
| 2020/0041588 A1 | 2/2020 | O'Halloran et al. | |
| 2020/0045112 A1 | 2/2020 | Sacolick et al. | |
| 2020/0058106 A1 | 2/2020 | Lazarus et al. | |
| 2020/0200844 A1 | 6/2020 | Boskamp et al. | |
| 2020/0209335 A1 | 7/2020 | O'Halloran et al. | |
| 2020/0289019 A1 | 9/2020 | Schlemper et al. | |
| 2020/0289022 A1 | 9/2020 | Coumans et al. | |
| 2020/0294229 A1 | 9/2020 | Schlemper et al. | |
| 2020/0294282 A1 | 9/2020 | Schlemper et al. | |
| 2020/0294287 A1 | 9/2020 | Schlemper et al. | |
| 2020/0337587 A1 | 10/2020 | Sacolick et al. | |
| 2020/0355765 A1 | 11/2020 | Chen et al. | |
| 2021/0048498 A1 | 2/2021 | Dyvorne et al. | |
| 2022/0043094 A1 | 2/2022 | O'Halloran et al. | |

FOREIGN PATENT DOCUMENTS

| | | |
|---|---|---|
| CN | 1374069 A | 10/2002 |
| EP | 1004892 A1 | 5/2000 |
| EP | 1197760 A2 | 4/2002 |
| JP | H09-10186 A | 1/1997 |

OTHER PUBLICATIONS

Li, Xia, et al. "Finite element analysis of gradient z-coil induced eddy currents in a permanent MRI magnet." Journal of Magnetic Resonance 208.1 (2011): 148-155. (Year: 2011).*
Invitation to Pay Additional Fees for Application No. PCT/US2019/061663, dated Mar. 5, 2020.
International Search Report and Written Opinion for International Application No. PCT/US2019/061663 dated Jun. 24, 2020.
International Search Report and Written Opinion for International Application No. PCT/US2020/046445 dated Dec. 3, 2020.
De Zanche et al., NMR probes for measuring magnetic fields and field dynamics in MR systems. Magnetic Resonance in Medicine: An Official Journal of the International Society for Magnetic Resonance in Medicine. Jul. 2008;60(1):176-86.
Van Vaals et al., Optimization of eddy-current compensation. Journal of Magnetic Resonance (1969). Oct. 15, 1990;90(1):52-70.
Wansapura et al., Temperature mapping of frozen tissue using eddy current compensated half excitation RF pulses. Magnetic Resonance in Medicine: An Official Journal of the International Society for Magnetic Resonance in Medicine. Nov. 2001; 46(5):985-92.
International Preliminary Report on Patentability for International Application No. PCT/US2019/061663 dated Jul. 8, 2021.
International Preliminary Report on Patentability for International Application No. PCT/US2020/046445 dated Dec. 3, 2020.
Eichler, et al., "Implementation of the First Order Reversal Curve Method for Identification of Weight Function in Preisach Model for Ferromagnetics," ELEKTRO 11th International Conference; IEEE; pp. 602-607; May 16-18, 2016 (15 pages).
First Office Action and Search Report on CN App. No. 201980093021.3 dated Oct. 27, 2023 (with English translation, 29 pages).

* cited by examiner

CORRECTING FOR HYSTERESIS IN MAGNETIC RESONANCE IMAGING

This application claims the benefit under 35 U.S.C. § 119(e) of U.S. provisional patent application Ser. No. 62/786,265, entitled "CORRECTING FOR HYSTERESIS IN MAGNETIC RESONANCE IMAGING", filed Dec. 28, 2018, which is herein incorporated by reference in its entirety.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to MRI that, for a given imaging application, may involve the relatively high cost of the equipment, limited availability and/or difficulty in gaining access to clinical MRI scanners and/or the length of the image acquisition process.

The trend in clinical MRI has been to increase the field strength of MRI scanners to improve one or more of scan time, image resolution, and image contrast, which, in turn, continues to drive up costs. The vast majority of installed MRI scanners operate at 1.5 or 3 tesla (T), which refers to the field strength of the main magnetic field $B_0$. A rough cost estimate for a clinical MRI scanner is approximately one million dollars per tesla, which does not factor in the substantial operation, service, and maintenance costs involved in operating such MRI scanners.

Additionally, conventional high-field MRI systems typically require large superconducting magnets and associated electronics to generate a strong uniform static magnetic field ($B_0$) in which an object (e.g., a patient) is imaged. The size of such systems is considerable with a typical MRI installment including multiple rooms for the magnet, electronics, thermal management system, and control console areas. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but due to one or more of the limitations discussed above, is not practical or is impossible, as discussed in further detail below.

SUMMARY

Some embodiments include an apparatus for controlling at least one gradient coil of a magnetic resonance imaging (MRI) system, the apparatus comprising at least one computer hardware processor; and at least one computer-readable storage medium storing processor executable instructions that, when executed by the at least one computer hardware processor, cause the at least one computer hardware processor to perform. The method includes receiving information specifying at least one target pulse sequence; determining a corrected pulse sequence to control the at least one gradient coil based on the at least one target pulse sequence and a hysteresis model of induced magnetization in the MRI system caused by operation of the at least one gradient coil; and controlling, using the corrected pulse sequence, the at least one gradient coil to generate one or more gradient pulses for imaging a patient.

Some embodiments include a method of controlling at least one gradient coil of a magnetic resonance imaging (MRI) system, the method comprising, with at least one computer hardware processor: receiving information specifying at least one target pulse sequence; determining a corrected pulse sequence to control the at least one gradient coil based on the at least one target pulse sequence and a hysteresis model of induced magnetization in the MRI system caused by operation of the at least one gradient coil; and controlling, using the corrected pulse sequence, the at least one gradient coil to generate one or more gradient pulses for imaging a patient.

Some embodiments include at least one computer-readable storage medium storing processor executable instructions that, when executed by at least one computer hardware processor, cause the at least one computer hardware processor to perform a method comprising: receiving information specifying at least one target pulse sequence; determining a corrected pulse sequence to control the at least one gradient coil based on the at least one target pulse sequence and a hysteresis model of induced magnetization in the MRI system caused by operation of the at least one gradient coil; and controlling, using the corrected pulse sequence, the at least one gradient coil to generate one or more gradient pulses for imaging a patient.

Some embodiments include a method of measuring hysteresis in a magnetic resonance imaging (MRI) system comprising at least one gradient coil, the method comprising: controlling the at least one gradient coil using a first pulse sequence comprising a first plurality of pulses; measuring, using a multi-element RF probe placed in an imaging region of the MRI system, a first plurality of magnetic field strengths in the imaging region of the MRI system, each of the first plurality of magnetic field strengths resulting, at least in part, from a respective one of the first plurality of pulses of the first pulse sequence; estimating parameters of a hysteresis model based on the measured first plurality of magnetic field strengths; and storing the parameters of the hysteresis model.

Some embodiments include at least one computer-readable storage medium storing processor executable instructions that, when executed by at least one computer hardware processor, cause the at least one computer hardware processor to perform a method of measuring hysteresis in a magnetic resonance imaging (MRI) system comprising at least one gradient coil, the method comprising: controlling the at least one gradient coil using a first pulse sequence comprising a first plurality of pulses; measuring, using a multi-element RF probe placed in an imaging region of the MRI system, a first plurality of magnetic field strengths in the imaging region of the MRI system, each of the first plurality of magnetic field strengths resulting, at least in part, from a respective one of the first plurality of pulses of the first pulse sequence; estimating parameters of a hysteresis model based on the measured first plurality of magnetic field strengths; and storing the parameters of the hysteresis model.

Some embodiments include An apparatus for controlling at least one gradient coil of a magnetic resonance imaging (MRI) system, the apparatus comprising at least one computer hardware processor and at least one computer-readable storage medium storing processor executable instructions that, when executed by the at least one computer hardware processor, cause the at least one computer hardware processor to perform a method. The method includes: controlling the at least one gradient coil using a first pulse sequence comprising a first plurality of pulses; measuring, using a multi-element RF probe placed in an imaging region of the MRI system, a first plurality of magnetic field strengths in the imaging region of the MRI system, each of the first plurality of magnetic field strengths resulting, at least in part, from a respective one of the first plurality of pulses of the first pulse sequence; estimating parameters of a hysteresis model based on the measured first plurality of magnetic field strengths; and storing the parameters of the hysteresis model.

Some embodiments include a multi-element probe for measuring hysteresis in a magnetic resonance imaging (MRI) system, the multi-element probe comprising: an RF transmit coil; a plurality of RF receiving elements; and a plurality of liquid samples, each liquid sample contained within a respective coil of the plurality of RF receiving elements.

Some embodiments include a method of measuring hysteresis in a magnetic resonance imaging (MRI) system comprising at least one electromagnet, the method comprising measuring the magnetic field in an imaging region of the MRI system using a multi-element probe. The multi-element probe includes: an RF transmit coil; a plurality of RF receiving elements; and a plurality of liquid samples, each liquid sample contained within a respective coil of the plurality of RF receiving elements.

BRIEF DESCRIPTION OF THE DRAWINGS

Various aspects and embodiments of the disclosed technology will be described with reference to the following figures. It should be appreciated that the figures are not necessarily drawn to scale.

DETAILED DESCRIPTION

Figure 1:
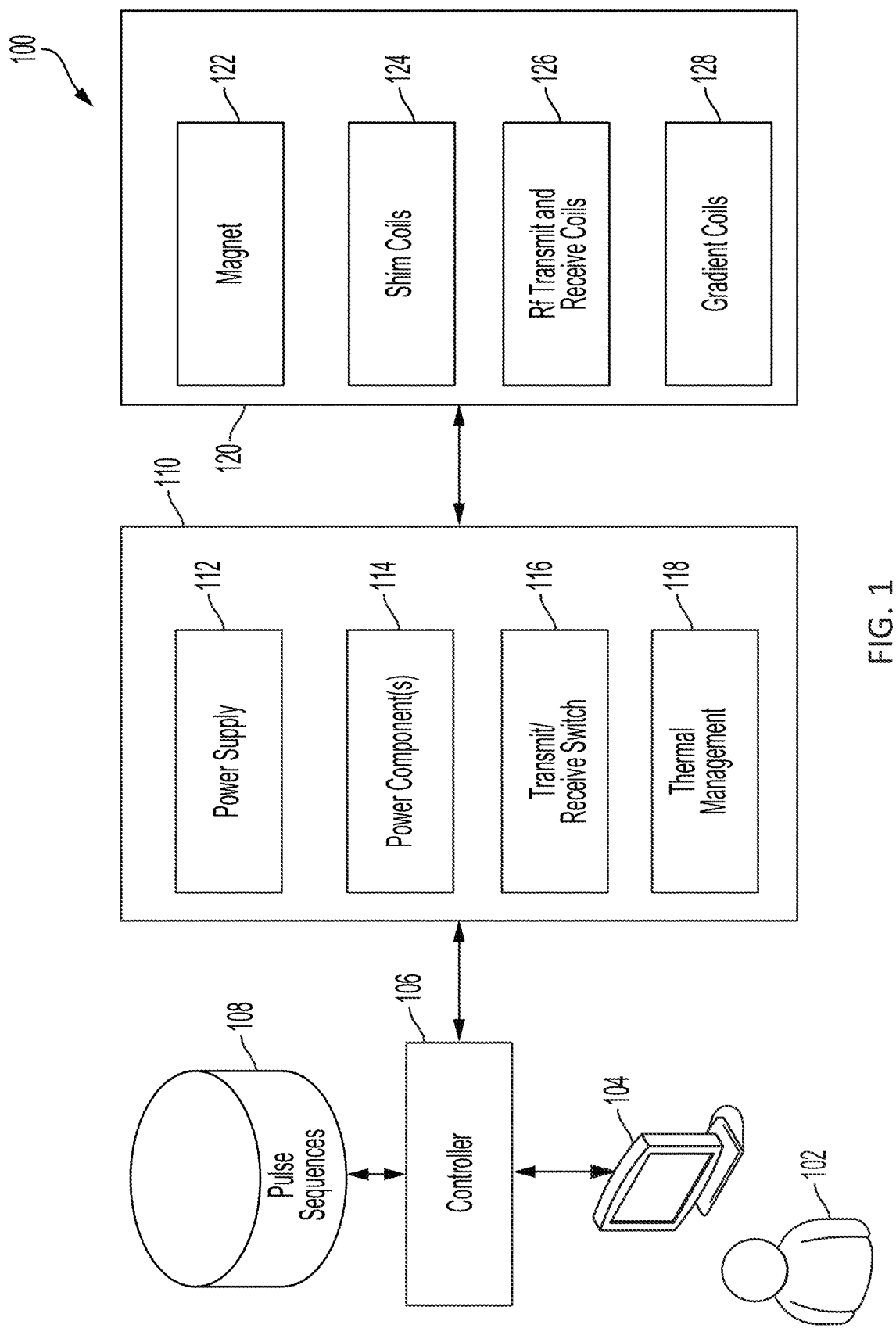
FIG. 1 illustrates exemplary components of a magnetic resonance imaging system.

The MRI scanner market is overwhelmingly dominated by high-field systems, and particularly for medical or clinical MRI applications. As discussed above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 mT are referred to herein as "ultra-low field."

As discussed above, conventional MRI systems require specialized facilities. An electromagnetically shielded room is required for the MRI system to operate and the floor of the room must be structurally reinforced. Additional rooms must be provided for the high-power electronics and the scan technician's control area. Secure access to the site must also be provided. In addition, a dedicated three-phase electrical connection must be installed to provide the power for the electronics that must, in turn, be cooled by a chilled water supply and additional HVAC capacity must be provided. These site requirements are not only costly, but significantly limit the locations where MRI systems can be deployed. Conventional clinical MRI scanners also require substantial expertise to both operate and maintain. These highly trained technicians and service engineers add large on-going operational costs to operating an MRI system. Conventional MRI, as a result, is cost prohibitive and severely limited in accessibility, preventing MRI from being a widely available diagnostic tool capable of delivering a wide range of clinical imaging solutions wherever and whenever needed. Patients must visit one of a limited number of facilities at a time and place scheduled in advance, preventing MRI from being used in numerous medical applications for which it is uniquely efficacious in assisting with diagnosis, surgery, patient monitoring and the like.

As discussed above, high-field MRI systems require specially adapted facilities to accommodate the size, weight, power consumption and shielding requirements of these systems. For example, a 1.5 T MRI system typically weighs between 4-10 tons and a 3 T MRI system typically weighs between 8-20 tons. In addition, high-field MRI systems generally require significant amounts of heavy and expensive shielding. Many mid-field scanners are even heavier, weighing between 10-20 tons due, in part, to the use of very large permanent magnets and/or yokes. Commercially available low-field MRI systems (e.g., operating with a $B_0$ magnetic field of 0.2 T) are also typically in the range of 10 tons or more due the large of amounts of ferromagnetic material used to generate the $B_0$ field, with additional tonnage in shielding. To accommodate this heavy equipment, rooms (which typically have a minimum size of 30-50 square meters) have to be built with reinforced flooring (e.g., concrete flooring), and must be specially shielded to prevent electromagnetic radiation from interfering with operation of the MRI system. Thus, available clinical MRI systems are immobile and require the significant expense of a large, dedicated space within a hospital or facility, and in addition to the considerable costs of preparing the space for operation, require further additional on-going costs in expertise in operating and maintaining the system.

In addition, currently available MRI systems typically consume large amounts of power. For example, common 1.5 T and 3 T MRI systems typically consume between 20-40 kW of power during operation, while available 0.5 T and 0.2 T MRI systems commonly consume between 5-20 kW. When discussing power consumption herein, average power consumed over an interval of interest will be referenced unless otherwise specified. For example, the 20-40 kW referred to above indicates the average power consumed by conventional MRI systems during the course of image acquisition, which may include relatively short periods of peak power consumption that significantly exceeds the average power consumption (e.g., when gradient coils and/or radio frequency (RF) coils are pulsed over relatively short periods of the pulse sequence). Intervals of peak (or large) power consumption are typically addressed via power storage elements (e.g., capacitors) of the MRI system itself. Thus, the average power consumption is the more relevant property as it generally determines the type of power connection needed to operate the device. Accordingly, available clinical MRI systems must have dedicated power sources as well, typically requiring a dedicated three-phase connection to the grid for operating the MRI system. Additional electronics are then needed to convert the three-phase power into single-phase power utilized by the MRI system. The many physical requirements of deploying conventional clinical MRI systems creates a significant problem of availability and severely restricts the clinical applications for which MRI can be utilized.

Accordingly, the many requirements of high-field MRI render installations prohibitive in many situations, limiting their deployment to large institutional hospitals or specialized facilities and generally restricting their use to tightly scheduled appointments, requiring the patient to visit dedicated facilities at times scheduled in advance. Thus, the many restrictions on high field MRI prevent MRI from being fully utilized as an imaging modality. Despite the drawbacks of high-field MRI mentioned above, the appeal of the significant increase in SNR at higher fields continues to drive the industry to higher and higher field strengths for use in clinical and medical MRI applications, further increasing the cost and complexity of MRI scanners, and further limiting their availability and preventing their use as a general-purpose and/or generally-available imaging solution.

The low SNR of MR signals produced in the low-field regime (particularly in the very low-field regime) has prevented the development of a relatively low cost, low power and/or portable MRI system. Conventional "low-field" MRI systems operate at the high end of what is typically characterized as the low-field range (e.g., clinically available low-field systems have a floor of approximately 0.2 T) to achieve useful images. Though somewhat less expensive then high-field MRI systems, conventional low-field MRI systems share many of the same drawbacks. In particular, conventional low-field MRI systems are large, fixed and immobile installments, consume substantial power (requiring dedicated three-phase power hook-ups) and require specially shielded rooms and large dedicated spaces. The challenges of low-field MRI have prevented the development of relatively low cost, low power and/or portable MRI systems that can produce useful images.

The inventors have developed techniques enabling portable, low-field, low power and/or lower-cost MRI systems that can improve the wide-scale deployability of MRI technology in a variety of environments beyond the current MRI installments at hospitals and research facilities. As a result, MRI can be deployed in emergency rooms, small clinics, doctor's offices, in mobile units, in the field, etc. and may be brought to the patient (e.g., bedside) to perform a wide variety of imaging procedures and protocols. Some embodiments include very low-field MRI systems (e.g., 0.1 T, 50 mT, 20 mT, etc.) that facilitate portable, low-cost, low-power MRI, significantly increasing the availability of MRI in a clinical setting.

There are numerous challenges to developing a clinical MRI system in the low-field regime. As used herein, the term clinical MRI system refers to an MRI system that produces clinically useful images, which refers to an images having sufficient resolution and adequate acquisition times to be useful to a physician or clinician for its intended purpose given a particular imaging application. As such, the resolutions/acquisition times of clinically useful images will depend on the purpose for which the images are being obtained. Among the numerous challenges in obtaining clinically useful images in the low-field regime is the relatively low SNR. In particular, the relationship between SNR and $B_0$ field strength is approximately $B_0^{5/4}$ at field strength above 0.2 T and approximately $B_0^{3/2}$ at field strengths below 0.1 T. As such, the SNR drops substantially with decreases in field strength with even more significant drops in SNR experienced at very low field strength. This substantial drop in SNR resulting from reducing the field strength is a significant factor that has prevented development of clinical MRI systems in the very low-field regime. In particular, the challenge of the low SNR at very low field strengths has prevented the development of a clinical MRI system operating in the very low-field regime. As a result, clinical MRI systems have been limited to approximately the 0.2 T range and above, which systems are large, heavy (and costly) MRI systems that consume significant power, generally requiring fixed dedicated spaces (or shielded tents) and dedicated power sources.

The inventors have recognized and appreciated that to develop low-field and very low-field MRI systems capable of producing clinically useful images the SNR should be increased. Sources of noise and errors that are conventionally ignored in high-field MRI systems (due to these errors being small relative to the strength of the magnetic fields in the high-field systems) may reduce the SNR of low-field MRI systems and significantly impact the quality of resulting images. Thus, these sources of noise and errors create problems that were not addressed in the development of large-field MRI systems, and these problems are important to address in low-field MRI systems to ensure the highest possible SNR.

The inventors have recognized that hysteresis effects, due to induced magnetization in ferromagnetic materials, reduce the SNR and/or cause imaging errors in low-field MRI systems. Many components of MRI systems and associated surroundings are formed from or include ferromagnetic materials that are susceptible to magnetization induced by one or more electromagnets of the MRI system. When the ferromagnetic material of the various components is magnetized, the resulting magnetic fields affects the magnetic field in an imaging region of the MRI system, including the $B_0$ field, linear gradient fields and higher order terms. In high-field MRI systems, magnetic fields created by induced magnetization of ferromagnetic materials of various components of the system may be ignored due to the small magnitude of these fields relative to the high-field strength of the magnets of the MRI system. However, hysteresis effects should be addressed in low-field MRI systems to increase the SNR.

For example, a low-field MRI system may include a magnetic system with permanent magnet plates connected by a ferromagnetic yoke (see, e.g., FIG. 2A below). Such a low-field MRI system includes one or more gradient coils used to gradient magnetic fields in the imaging region of the low-field MRI system. A gradient pulse sequence is used to control the magnetic field generated by the gradient coil such that the magnetic field in the imaging region varies as a function of time. The dynamic magnetic field generated by the gradient coil(s) induces a magnetization in the permanent magnet plates, the ferromagnetic yoke, and other components of the MRI system made of ferromagnetic material. The induced magnetization is a hysteresis effect that creates a magnetic field in the imaging region in addition to the magnetic field created by the gradient coil(s). Consequently, the actual magnetic field present in the imaging region is no longer precisely controlled by the gradient coil(s), but is instead a sum of the magnetic field generated by the gradient coil(s) and the magnetic field generated by the induced magnetization (and the magnetic field created by other magnets of the MRI system, such as a $B_0$ magnet). Not having precise control over the magnetic field is in the imaging region reduces SNR and the quality of resulting MRI images.

One approach to reducing the errors caused by hysteresis effects in low-field MRI systems is to include degaussing pulses during an imaging routine. However, the addition of degaussing pulses increases the time it takes to execute the imaging routine and/or requires extra gradient correction lobes, which offer incomplete correction for the hysteresis effect. The inventors have developed a technique for reducing the imaging errors resulting from hysteresis effects that does not increase the duration of the imaging routine by adding additional degaussing pulses.

The inventors have recognized that the hysteresis effects induced in a low-field MRI system may be measured in advance of using the low-field MRI system to image a patient. In turn, the measurements may be used to create a hysteresis model of the hysteresis effects, which may be used to compensate for these effects during subsequent imaging. For example, the hysteresis model may be used to modify a target pulse sequence to determine a corrected pulse sequence to control the electromagnets (e.g., the gradient coils) of the MRI system to create the desired magnetic field strength in the imaging region of the MRI system. Because the hysteresis effects are taken into account when determining the pulse sequence used to control the electromagnets, in some embodiments, the desired magnetic field strength may reflect contributions of the induced magnetization of the MRI system and the magnetic field created by the electromagnetics controlled by the corrected pulse sequence.

Accordingly, in some embodiments, a hysteresis model is used to determine a corrected pulse sequence for controlling one or more electromagnets of the MRI system. It is noted that the exact location of the induced magnetization need not be determined. For example, a yoke, other magnetic components, a housing, electronic components, and/or any number of other components of the MRI system may be made from ferromagnetic material and may exhibit hysteresis effects. The amount of induced magnetization associated with each component need not be determined. By making a measurement of the hysteresis effects in advance of the imaging routing, induced magnetization from any ferromagnetic materials present at the time of the measurement may be collectively taken into account by the hysteresis model. Using such techniques, the inventors have observed an increase in SNR of approximately 15%.

In some embodiments an apparatus for controlling at least one gradient coil of a MRI system includes at least one computer hardware processor; and at least one computer-readable storage medium storing processor executable instructions that, when executed by the at least one computer hardware processor, cause the at least one computer hardware processor to perform a method comprising: receiving at least one target gradient pulse sequence; determining a corrected gradient field pulse sequence to drive the at least one gradient coil based on the at least one target gradient pulse sequence and a history of at least one control setting for the at least one gradient coil; and controlling the at least one gradient coil using the corrected gradient pulse sequence.

In some embodiments, the MRI system includes a ferromagnetic yoke and the hysteresis model represents effects of hysteresis induced at least in the ferromagnetic yoke by operation of the at least one gradient coil.

In some embodiments, determining the corrected pulse sequence may include adjusting an amplitude of a pulse within a target gradient pulse sequence of the target pulse sequence. Alternatively or additionally, determining the corrected pulse sequence may include determining a corrected transmit radio frequency (RF) pulse sequence used to control a RF transmit coil and/or a corrected receive RF pulse sequence used to control a RF receive coil. For example, determining a corrected transmit RF pulse sequence may include adjusting a center frequency or phase of a transmit RF pulse of the corrected transmit RF pulse sequence; and determining a corrected receive RF pulse sequence may include adjusting a center frequency or phase of a receive RF pulse of the corrected receive RF pulse sequence.

The inventors have further recognized that a multi-element probe may be placed within the MRI system to measure the hysteresis effects. The multi-element probe includes a number of receiving elements for measuring the magnetic field within the imaging region of the MRI system. The measurements are then used to determine a model of the hysteresis effects induced in the MRI system. The hysteresis effects induced in the MRI system depend on a history of the pulse sequences applied to the electromagnets. Accordingly, the magnetic field in the imaging region resulting from induced magnetization may be measured for multiple different pulse sequences.

In some embodiments, a multi-element probe for measuring hysteresis in a MRI system includes: an RF transmit coil; a plurality of RF receiving elements; and a plurality of liquid samples, each liquid sample contained within a respective coil of the plurality of RF receiving elements.

Some embodiments include a method of measuring hysteresis in a magnetic MRI system comprising at least one electromagnet, the method including: measuring the magnetic field in an imaging region of the MRI system using a multi-element probe, the multi-element probe comprising: an RF transmit coil; a plurality of RF receiving elements; and a plurality of liquid or gel samples, each liquid or gel sample contained within a respective coil of the plurality of RF receiving elements.

Some embodiments include a method of measuring hysteresis in a MRI system comprising at least one gradient coil, the method comprising: controlling the at least one gradient coil using a first pulse sequence comprising a first plurality of pulses; measuring, using a multi-element RF probe placed in an imaging region of the MRI system, a first plurality of magnetic field strengths in the imaging region of the MRI system, each of the first plurality of magnetic field strengths resulting, at least in part, from a respective one of the first plurality of pulses of the first pulse sequence; estimating parameters of a hysteresis model based on the measured first plurality of magnetic field strengths; and storing the parameters of the hysteresis model.

FIG. 1 is a block diagram of typical components of a MRI system 100. In the illustrative example of FIG. 1, MRI system 100 comprises computing device 104, controller 106, pulse sequences storage device 108, power management system 110, and magnetics components 120. It should be appreciated that system 100 is illustrative and that a MRI system may have one or more other components of any suitable type in addition to or instead of the components illustrated in FIG. 1. However, a MRI system will generally include these high level components, though the implementation of these components for a particular MRI system may differ vastly, as discussed in further detail below.

As illustrated in FIG. 1, magnetics components 120 comprise $B_0$ magnet 122, shim coils 124, RF transmit and receive coils 126, and gradient coils 128. Magnet 122 may be used to generate the main magnetic field $B_0$. Magnet 122 may be any suitable type or combination of magnetics components that can generate a desired main magnetic $B_0$ field. As discussed above, in the high field regime, the $B_0$ magnet is typically formed using superconducting material generally provided in a solenoid geometry, requiring cryogenic cooling systems to keep the $B_0$ magnet in a superconducting state. Thus, high-field $B_0$ magnets are expensive, complicated and consume large amounts of power (e.g., cryogenic cooling systems require significant power to maintain the extremely low temperatures needed to keep the $B_0$ magnet in a superconducting state), require large dedicated spaces, and specialized, dedicated power connections (e.g., a dedicated three-phase power connection to the power grid). Conventional low-field $B_0$ magnets (e.g., $B_0$ magnets operating at 0.2 T) are also often implemented using superconducting material and having these same general requirements. Other conventional low-field $B_0$ magnets are implemented using permanent magnets, which in order to produce the field strengths to which conventional low-field systems are limited to (e.g., between 0.2 T and 0.3 T) due to the inability to acquire useful images at lower field strengths, need to be very large magnets weighing 5-20 tons. Thus, the $B_0$ magnet of conventional MRI systems alone prevents both portability and affordability.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by magnet 122 and/or shim coils 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. For example, a first gradient coil may be configured to selectively vary the $B_0$ field in a first (X) direction to perform frequency encoding in that direction, a second gradient coil may be configured to selectively vary the $B_0$ field in a second (Y) direction substantially orthogonal to the first direction to perform phase encoding, and a third gradient coil may be configured to selectively vary the $B_0$ field in a third (Z) direction substantially orthogonal to the first and second directions to enable slice selection for volumetric imaging applications. As discussed above, conventional gradient coils also consume significant power, typically operated by large, expensive gradient power sources, as discussed in further detail below.

MRI is performed by exciting and detecting emitted MR signals using transmit and receive coils, respectively (often referred to as radio frequency coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx coils to generically refer to the various configurations for the transmit and receive magnetics component of an MRI system. These terms are used interchangeably herein. In FIG. 1, RF transmit and receive coils 126 comprise one or more transmit coils that may be used to generate RF pulses to induce an oscillating magnetic field $B_1$. The transmit coil(s) may be configured to generate any suitable types of RF pulses.

Power management system 110 includes electronics to provide operating power to one or more components of the low-field MRI system 100. For example, as discussed in more detail below, power management system 110 may include one or more power supplies, gradient power components, transmit coil components, and/or any other suitable power electronics needed to provide suitable operating power to energize and operate components of MRI system 100. As illustrated in FIG. 1, power management system 110 comprises power supply 112, power component(s) 114, transmit/receive switch 116, and thermal management components 118 (e.g., cryogenic cooling equipment for superconducting magnets). Power supply 112 includes electronics to provide operating power to magnetic components 120 of the MRI system 100. For example, power supply 112 may include electronics to provide operating power to one or more $B_0$ coils (e.g., $B_0$ magnet 122) to produce the main magnetic field for the low-field MRI system. Transmit/receive switch 116 may be used to select whether RF transmit coils or RF receive coils are being operated.

Power component(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shim coils (e.g., shim coils 124).

In conventional MRI systems, the power components are large, expensive and consume significant power. Typically, the power electronics occupy a room separate from the MRI scanner itself. The power electronics not only require substantial space, but are expensive complex devices, that consume substantial power and require wall mounted racks to be supported. Thus, the power electronics of conventional MRI systems also prevent portability and affordable of MRI.

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetic components 120 in a desired sequence (e.g., parameters for operating the RF transmit and receive coils 126, parameters for operating gradient coils 128, etc.). As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information. In conventional MRI systems, computing device 104 typically includes one or more high performance work-stations configured to perform computationally expensive processing on MR data relatively rapidly. Such computing devices are relatively expensive equipment on their own.

In some embodiments, controller 106 may include a computer hardware processor (not shown) and at least one computer-readable storage medium (not shown) storing processor executable instructions that, when executed by the at least one computer hardware processor, cause the at least one computer hardware processor to perform one or more methods. The methods may include methods of determining a pulse sequence to use to control the MRI system 100. Additionally or alternatively, the methods may include a method for measuring hysteresis effects induced in the MRI system 100 and/or determining a hysteresis model associated with the MRI system 100.

In some embodiments, controller 106 may be configured to implement a pulse sequence by obtaining information about the pulse sequence from pulse sequences storage device 108, which stores information for each of one or more pulse sequences. Information stored by pulse sequences storage device 108 for a particular pulse sequence may be any suitable information that allows controller 106 to implement the particular pulse sequence. For example, information stored in pulse sequences storage device 108 for a pulse sequence may include one or more parameters for operating magnetics components 120 in accordance with the pulse sequence (e.g., parameters for operating the RF transmit and receive coils 126, parameters for operating gradient coils 128, etc.), one or more parameters for operating power system 110 in accordance with the pulse sequence, one or more programs comprising instructions that, when executed by controller 106, cause controller 106 to control MRI system 100B to operate in accordance with the pulse sequence, and/or any other suitable information. Information stored in pulse sequences storage device 108 may be stored on one or more non-transitory storage media.

In some embodiments, the pulse sequences storage device 108 may also store information related to the measured hysteresis induced in the MRI system 100. For example, the measurement data itself may be stored. Additionally or alternatively, a hysteresis model may be stored in the pulse sequences storage device 108. Alternatively, in other embodiments, information about the hysteresis may be stored in a storage device separate from the pulse sequences storage device 108.

As should be appreciated from the foregoing, currently available clinical MRI systems (including high-field, mid-field and low-field systems) are large, expensive, fixed installations requiring substantial dedicated and specially designed spaces, as well as dedicated power connections. The inventors have developed low-field, including very-low field, MRI systems that are lower cost, lower power and/or portable, significantly increasing the availability and applicability of MRI. According to some embodiments, a portable MRI system is provided, allowing an MRI system to be brought to the patient and utilized at locations where it is needed.

As discussed above, some embodiments include an MRI system that is portable, allowing the MRI device to be moved to locations in which it is needed (e.g., emergency and operating rooms, primary care offices, neonatal intensive care units, specialty departments, emergency and mobile transport vehicles and in the field). There are numerous challenges that face the development of a portable MRI system, including size, weight, power consumption and the ability to operate in relatively uncontrolled electromagnetic noise environments (e.g., outside a specially shielded room). As discussed above, currently available clinical MRI systems range from approximately 4-20 tons. Thus, currently available clinical MRI systems are not portable because of the sheer size and weight of the imaging device itself, let alone the fact that currently available systems also require substantial dedicated space, including a specially shielded room to house the MRI scanner and additional rooms to house the power electronics and the technician control area, respectively. The inventors have developed MRI systems of suitable weight and size to allow the MRI system to be transported to a desired location, some examples of which are discussed in further detail below.

A further aspect of portability involves the capability of operating the MRI system in a wide variety of locations and environments. As discussed above, currently available clinical MRI scanners are required to be located in specially shielded rooms to allow for correct operation of the device and is one (among many) of the reasons contributing to the cost, lack of availability and non-portability of currently available clinical MRI scanners. Thus, to operate outside of a specially shielded room and, more particularly, to allow for generally portable, cartable or otherwise transportable MRI, the MRI system must be capable of operation in a variety of noise environments. The inventors have developed noise suppression techniques that allow the MRI system to be operated outside of specially shielded rooms, facilitating both portable/transportable MRI as well as fixed MRI installments that do not require specially shielded rooms. While the noise suppression techniques allow for operation outside specially shielded rooms, these techniques can also be used to perform noise suppression in shielded environments, for example, less expensive, loosely or ad-hoc shielding environments, and can be therefore used in conjunction with an area that has been fitted with limited shielding, as the aspects are not limited in this respect.

A further aspect of portability involves the power consumption of the MRI system. As also discussed above, current clinical MRI systems consume large amounts of power (e.g., ranging from 20 kW to 40 kW average power consumption during operation), thus requiring dedicated power connections (e.g., dedicated three-phase power connections to the grid capable of delivering the required power). The requirement of a dedicated power connection is a further obstacle to operating an MRI system in a variety of locations other than expensive dedicated rooms specially fitted with the appropriate power connections. The inventors have developed low power MRI systems capable of operating using mains electricity such as a standard wall outlet (e.g., 120V/20 A connection in the U.S.) or common large appliance outlets (e.g., 220-240V/30 A), allowing the device to be operated anywhere common power outlets are provided. The ability to "plug into the wall" facilitates both portable/transportable MRI as well as fixed MRI system installations without requiring special, dedicated power such as a three-phase power connection.

As discussed above, a significant contributor to the size, cost and power consumption of conventional MRI systems are the power electronics for powering the magnetics components of the MRI system. The power electronics for conventional MRI systems often require a separate room, are expensive and consume significant power to operate the corresponding magnetics components. In particular, the gradient coils and thermal management systems utilized to cool the gradient coils alone generally require dedicated power connections and prohibit operation from standard wall outlets. The inventors have developed low power, low noise gradient power sources capable of powering the gradient coils of an MRI system that can, in accordance with some embodiments, be housed in the same portable, cartable or otherwise transportable apparatus as the magnetics components of the MRI system. According to some embodiments, the power electronics for powering the gradient coils of an MRI system consume less than 50 W when the system is idle and between 100-200 W when the MRI system is operating (i.e., during image acquisition). The inventors have developed power electronics (e.g., low power, low noise power electronics) to operate a portable low field MRI system that all fit within the footprint of the portable MRI scanner. According to some embodiments, innovative mechanical design has enabled the development of an MRI scanner that is maneuverable within the confines of a variety of clinical environments in which the system is needed.

At the core of developing a low power, low cost and/or portable MRI system is the reduction of the field strength of the $B_0$ magnet, which can facilitate a reduction in size, weight, expense and power consumption. However, as discussed above, reducing the field strength has a corresponding and significant reduction in SNR. This significant reduction in SNR has prevented clinical MRI systems from reducing the field strength below the current floor of approximately 0.2 T, which systems remains large, heavy, expensive fixed installations requiring specialized and dedicated spaces. While some systems have been developed that operate between 0.1 T and 0.2 T, these systems are often specialized devices for scanning extremities such as the hand, arm or knee. The inventors have developed MRI systems operating in the low-field and very-low field capable of acquiring clinically useful images. Some embodiments include highly efficient pulse sequences in producing MR signals and/or some embodiments include optimized receive coils for detecting emitted MR signals, examples of which are discussed in further detail below. Measuring and modeling the hysteresis effects induced in the MRI system followed by determining corrected pulse sequences using the hysteresis model facilitate the reduction of imaging errors resulting from variations in the magnetic field in the imaging region caused by induced magnetic fields, as discussed above and in further detail below.

According to some embodiments, designs developed by the inventors also reduce the cost and complexity of operating and maintaining the MRI scanner. For example, conventional clinical MRI systems require significant expertise to both operate and maintain, resulting in significant ongoing costs of these systems. The inventors have developed easy-to-use an MRI systems that allow minimally trained or untrained personnel to operate and/or maintain the system. According to some embodiments, automated setup processes allow the MRI scanner to automatically probe and adapt to its environment to prepare for operation. Network connectivity allows the MRI system to be operated from a mobile device such as a tablet, notepad or smart phone with easy-to-use interfaces configured to automatically run desired scanning protocols. Acquired images are immediately transferred to a secure cloud server for data sharing, telemedicine and/or deep learning. Moreover, in some embodiments, an easy-to-use multi-element probe is used to measure the hysteresis effects induced in the MRI system. An automated measurement process allows the MRI system to automatically measure and determine the hysteresis model for the MRI system. Moreover, the determination of the corrected pulse sequences is automated such that no special expertise is needed to reduce the errors that result from induced magnetization of ferromagnetic components of the MRI system.

Following below are more detailed descriptions of various concepts related to, and embodiments of, lower cost, lower power and/or portable low-field MRI. It should be appreciated that the embodiments described herein may be implemented in any of numerous ways. Examples of specific implementations are provided below for illustrative purposes only. It should be appreciated that the embodiments and the features/capabilities provided may be used individually, all together, or in any combination of two or more, as aspects of the technology described herein are not limited in this respect.

A significant contributor to the high cost, size, weight and power consumption of high-field MRI is the $B_0$ magnet itself along with the apparatus required to power the $B_0$ magnet and to perform thermal management thereof. In particular, to produce the field strengths characteristic of high-field MRI, the $B_0$ magnet is typically implemented as an electromagnet configured in a solenoid geometry using superconducting wires that need a cryogenic cooling system to keep the wires in a superconducting state. Not only is the superconducting material itself expensive, but the cryogenic equipment to maintain the superconducting state is also expensive and complex.

The inventors have recognized that the low-field context allows for $B_0$ magnet designs not feasible in the high-field regime. For example, due at least in part to the lower field strengths, superconducting material and the corresponding cryogenic cooling systems can be eliminated. Due in part to the low-field strengths, $B_0$ electromagnets constructed using non-superconducting material (e.g., copper) may be employed in the low-field regime. However, such electromagnets still may consume relatively large amounts of power during operation. For example, operating an electromagnet using a copper conductor to generate a magnetic field of 0.2 T or more requires a dedicated or specialized power connection (e.g., a dedicated three-phase power connection). The inventors have developed MRI systems that can be operated using mains electricity (i.e., standard wall power), allowing the MRI system to be powered at any location having common power connection, such as a standard wall outlet (e.g., 120V/20 A connection in the U.S.) or common large appliance outlets (e.g., 220-240V/30 A). Thus, a low-power MRI system facilitates portability and availability, allowing an MRI system to be operated at locations where it is needed (e.g., the MRI system can be brought to the patient instead of vice versa), examples of which are discussed in further detail below. In addition, operating from standard wall power eliminates the electronics conventionally needed to convert three-phase power to single-phase power and to smooth out the power provided directly from the grid. Instead, wall power can be directly converted to DC and distributed to power the components of the MRI system.

Figure 2A:
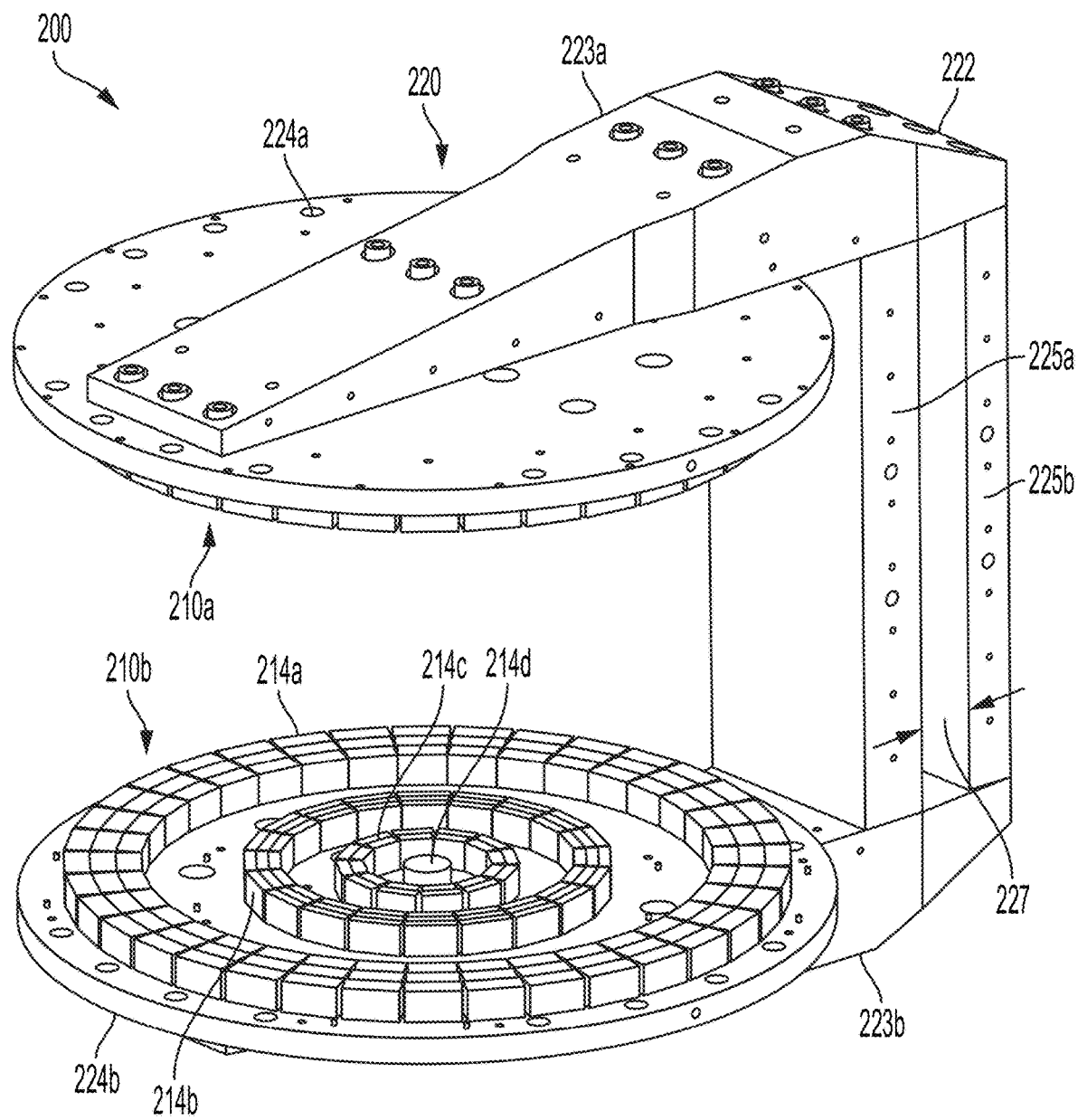
FIG. 2A illustrates a $B_0$ magnet comprising a plurality of permanent magnets, in accordance with some embodiments.

FIG. 2A illustrates a permanent $B_0$ magnet, in accordance with some embodiments. In particular, $B_0$ magnet 200 is formed by permanent magnets 210a and 210b arranged in a bi-planar geometry and a yoke 220 that captures electromagnetic flux produced by the permanent magnets and transfers the flux to the opposing permanent magnet to increase the flux density between permanent magnets 210a and 210b. Each of permanent magnets 210a and 210b are formed from a plurality of concentric permanent magnets. In particular, as visible in FIG. 2, permanent magnet 210b comprises an outer ring of permanent magnets 214a, a middle ring of permanent magnets 214b, an inner ring of permanent magnets 214c, and a permanent magnet disk 214d at the center. Permanent magnet 210a may comprise the same set of permanent magnet elements as permanent magnet 210b.

The permanent magnet material used may be selected depending on the design requirements of the system. For example, according to some embodiments, the permanent magnets (or some portion thereof) may be made of NdFeB, which produces a magnetic field with a relatively high magnetic field per unit volume of material once magnetized. According to some embodiments, SmCo material is used to form the permanent magnets, or some portion thereof. While NdFeB produces higher field strengths (and in general is less expensive than SmCo), SmCo exhibits less thermal drift and thus provides a more stable magnetic field in the face of temperature fluctuations. Other types of permanent magnet material(s) may be used as well, as the aspects are not limited in this respect. In general, the type or types of permanent magnet material utilized will depend, at least in part, on the field strength, temperature stability, weight, cost and/or ease of use requirements of a given $B_0$ magnet implementation.

The permanent magnet rings are sized and arranged to produce a homogenous field of a desired strength in the central region (field of view) between permanent magnets 210a and 210b. In the exemplary embodiment illustrated in FIG. 2A, each permanent magnet ring comprises a plurality segments, each segment formed using a plurality of blocks that are stacked in the radial direction and positioned adjacent to one another about the periphery to form the respective ring. The inventors have appreciated that by varying the width (in the direction tangent to the ring) of each permanent magnet, less waste of useful space may be achieved while using less material. For example, the space between stacks that does not produce useful magnetic fields can be reduced by varying the width of the blocks, for example, as function of the radial position of the block, allowing for a closer fit to reduce wasted space and maximize the amount of magnetic field that can be generated in a given space. The dimensions of the blocks may also be varied in any desired way to facilitate the production of a magnetic field of desired strength and homogeneity, as discussed in further detail below.

$B_0$ magnet 200 further comprises yoke 220 configured and arranged to capture magnetic flux generated by permanent magnets 210a and 210b and direct it to the opposing side of the $B_0$ magnet to increase the flux density in between permanent magnets 210a and 210b, increasing the field strength within the field of view of the $B_0$ magnet. By capturing magnetic flux and directing it to the region between permanent magnets 210a and 210b, less permanent magnet material can be used to achieve a desired field strength, thus reducing the size, weight and cost of the $B_0$ magnet. Alternatively, for given permanent magnets, the field strength can be increased, thus improving the SNR of the system without having to use increased amounts of permanent magnet material. For exemplary $B_0$ magnet 200, yoke 220 comprises a frame 222 and plates 224a and 224b. Plates 224a and 224b capture magnetic flux generated by permanent magnets 210a and 210b and direct it to frame 222 to be circulated via the magnetic return path of the yoke to increase the flux density in the field of view of the $B_0$ magnet. Yoke 220 may be constructed of any desired ferromagnetic material, for example, low carbon steel, CoFe and/or silicon steel, etc. to provide the desired magnetic properties for the yoke. According to some embodiments, plates 224a and 224b (and/or frame 222 or portions thereof) may be constructed of silicon steel or the like in areas where the gradient coils could most prevalently induce eddy currents.

Exemplary frame 222 comprises arms 223a and 223b that attach to plates 224a and 224b, respectively, and supports 225a and 225b providing the magnetic return path for the flux generated by the permanent magnets. The arms are generally designed to reduce the amount of material needed to support the permanent magnets while providing sufficient cross-section for the return path for the magnetic flux generated by the permanent magnets. Arms 223a has two supports within a magnetic return path for the $B_0$ field produced by the $B_0$ magnet. Supports 225a and 225b are produced with a gap 227 formed between, providing a measure of stability to the frame and/or lightness to the structure while providing sufficient cross-section for the magnetic flux generated by the permanent magnets. For example, the cross-section needed for the return path of the magnetic flux can be divided between the two support structures, thus providing a sufficient return path while increasing the structural integrity of the frame. It should be appreciated that additional supports may be added to the structure, as the technique is not limited for use with only two supports and any particular number of multiple support structures.

As discussed above, exemplary permanent magnets 210a and 210b comprise a plurality of rings of permanent magnetic material concentrically arranged with a permanent magnet disk at the center. Each ring may comprise a plurality of stacks of ferromagnetic material to form the respective ring, and each stack may include one or more blocks, which may have any number (including a single block in some embodiments and/or in some of the rings). The blocks forming each ring may be dimensioned and arranged to produce a desired magnetic field. The inventors have recognized that the blocks may be dimensioned in a number of ways to decrease cost, reduce weight and/or improve the homogeneity of the magnetic field produced, as discussed in further detail in connection with the exemplary rings that together form permanent magnets of a $B_0$ magnet, in accordance with some embodiments.

Figure 2B:
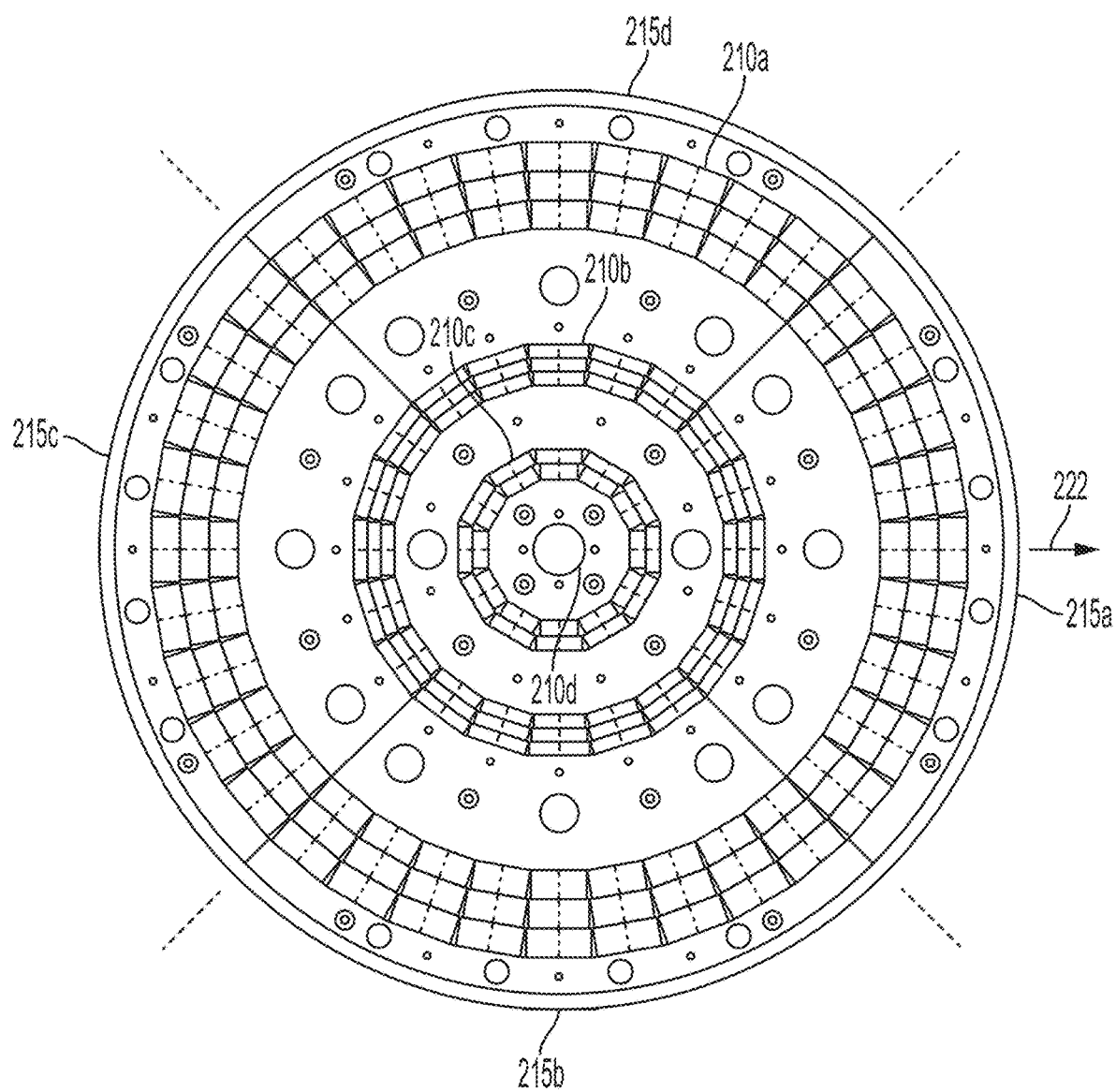
FIG. 2B illustrates a top view of an exemplary configuration of permanent magnet rings forming, in part, the $B_0$ magnet illustrated in FIG. 2A.

FIG. 2B illustrates a top-down view of a permanent magnet 210, which may, for example, be used as the design for permanent magnets 210a and 210b of $B_0$ magnet 200 illustrated in FIG. 2A. Permanent magnet 210 comprises concentric rings 210a, 210b, and 210c, each constructed of a plurality of stacks of ferromagnetic blocks, and a ferromagnetic disk 210d at the center. The direction of the frame of the yoke to which permanent magnet is attached is indicated by arrow 22. In embodiments in which the yoke is not symmetric (e.g., yoke 220), the yoke will cause the magnetic field produced by the permanent magnets for which it captures and focuses magnetic flux to be asymmetric as well, negatively impacting the uniformity of the $B_0$ magnetic field.

According to some embodiments, the block dimensions are varied to compensate for the effects of the yoke on the magnetic field produced by the permanent magnet. For example, dimensions of blocks in the four regions 215a, 215b, 215c and 215d labeled in FIG. 2B may be varied depending on which region the respective block is located. In particular, the height of the blocks (e.g., the dimension of the block normal to the plane of the circular magnet 210) may be greater in region 215c farthest away from the frame than corresponding blocks in region 215a closest to the frame. Block height can be varied in one or more rings or portions thereof, as the technique of compensating for the effects of the yoke are not limited to varying any particular block, set of blocks and/or any particular dimension. One example of varying block dimension to compensate for yoke effects are discussed in further detail below.

Figure 3:
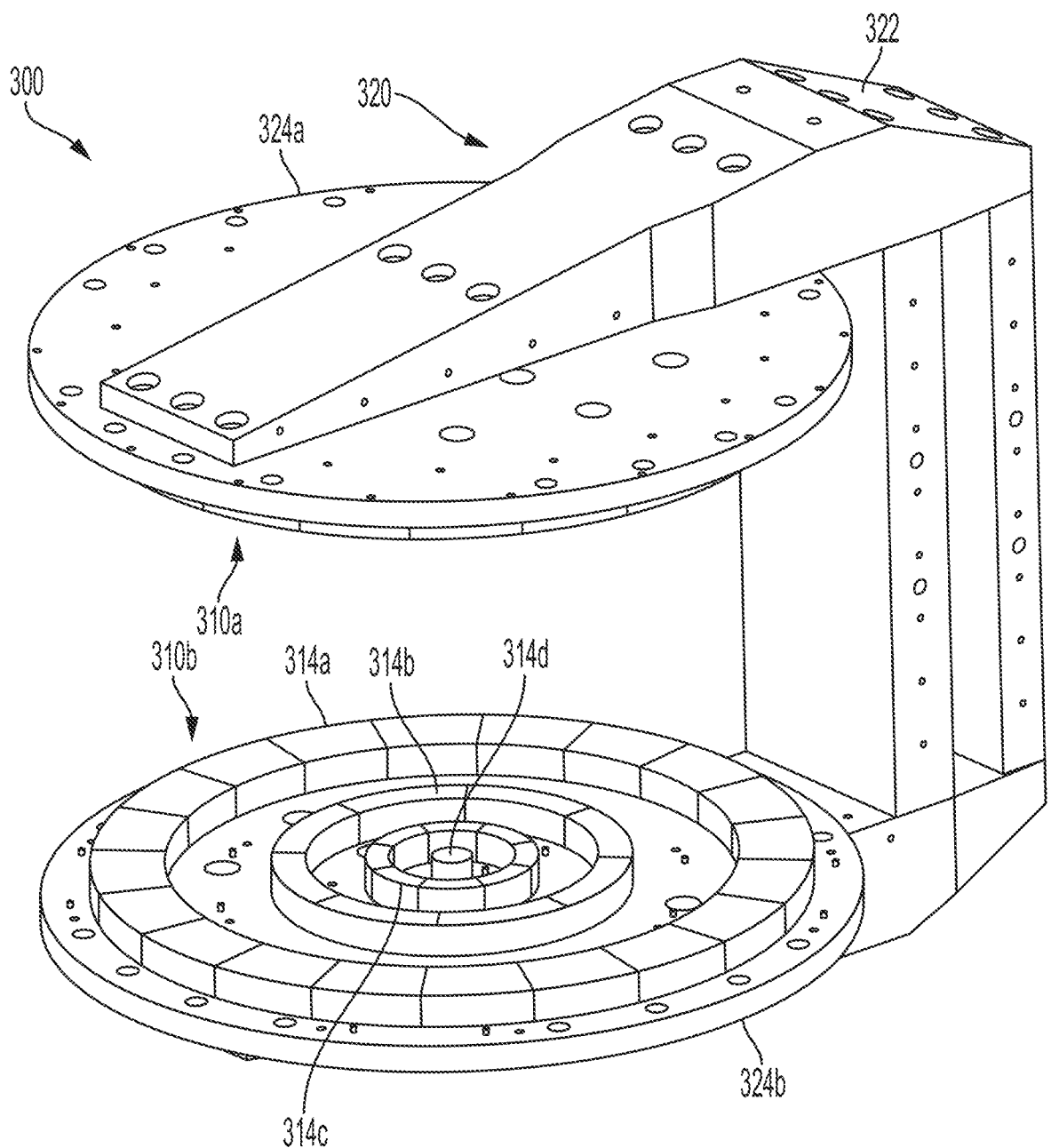
FIG. 3 illustrates a B0 magnet comprising a plurality of permanent magnets, in accordance with some embodiments.

FIG. 3 illustrates a $B_0$ magnet 300, in accordance with some embodiments. $B_0$ magnet 300 may share design components with $B_0$ magnet 200 illustrated in FIG. 2A and FIG. 2B. In particular, $B_0$ magnet 300 is formed by permanent magnets 310a and 310b arranged in a bi-planar geometry with a yoke 320 coupled thereto to capture electromagnetic flux produced by the permanent magnets and transfer the flux to the opposing permanent magnet to increase the flux density between permanent magnets 310a and 310b. Each of permanent magnets 310a and 310b are formed from a plurality of concentric permanent magnets, as shown by permanent magnet 310b comprising an outer ring of permanent magnets 314a, a middle ring of permanent magnets 314b, an inner ring of permanent magnets 314c, and a permanent magnet disk 314d at the center. Permanent magnet 310*a* may comprise the same set of permanent magnet elements as permanent magnet 310*b*. The permanent magnet material used may be selected depending on the design requirements of the system (e.g., NdFeB, SmCo, etc. depending on the properties desired).

The permanent magnet rings are sized and arranged to produce a homogenous field of a desired strength in the central region (field of view) between permanent magnets 310*a* and 310*b*. In particular, in the exemplary embodiment illustrated in FIG. 3, each permanent magnet ring comprises a plurality of circular arc segments sized and positioned to produce a desired $B_0$ magnetic field, as discussed in further detail below. In a similar manner to yoke 220 illustrated in FIG. 2A and FIG. 2B, yoke 320 is configured and arranged to capture magnetic flux generated by permanent magnets 310*a* and 310*b* and direct it to the opposing side of the $B_0$ magnet to increase the flux density in between permanent magnets 310*a* and 310*b*. Yoke 320 thereby increases the field strength within the field of view of the $B_0$ magnet with less permanent magnet material, reducing the size, weight and cost of the $B_0$ magnet. Yoke 320 also comprises a frame 322 and plates 324*a* and 324*b* that, in a manner similar to that described above in connection with yoke 320, captures and circulates magnetic flux generated by the permanent magnets 310*a* and via the magnetic return path of the yoke to increase the flux density in the field of view of the $B_0$ magnet. The structure of yoke 320 may be similar to that described above to provide sufficient material to accommodate the magnetic flux generated by the permanent magnets and providing sufficient stability, while minimizing the amount of material used to, for example, reduce the cost and weight of the $B_0$ magnet.

Figure 4:
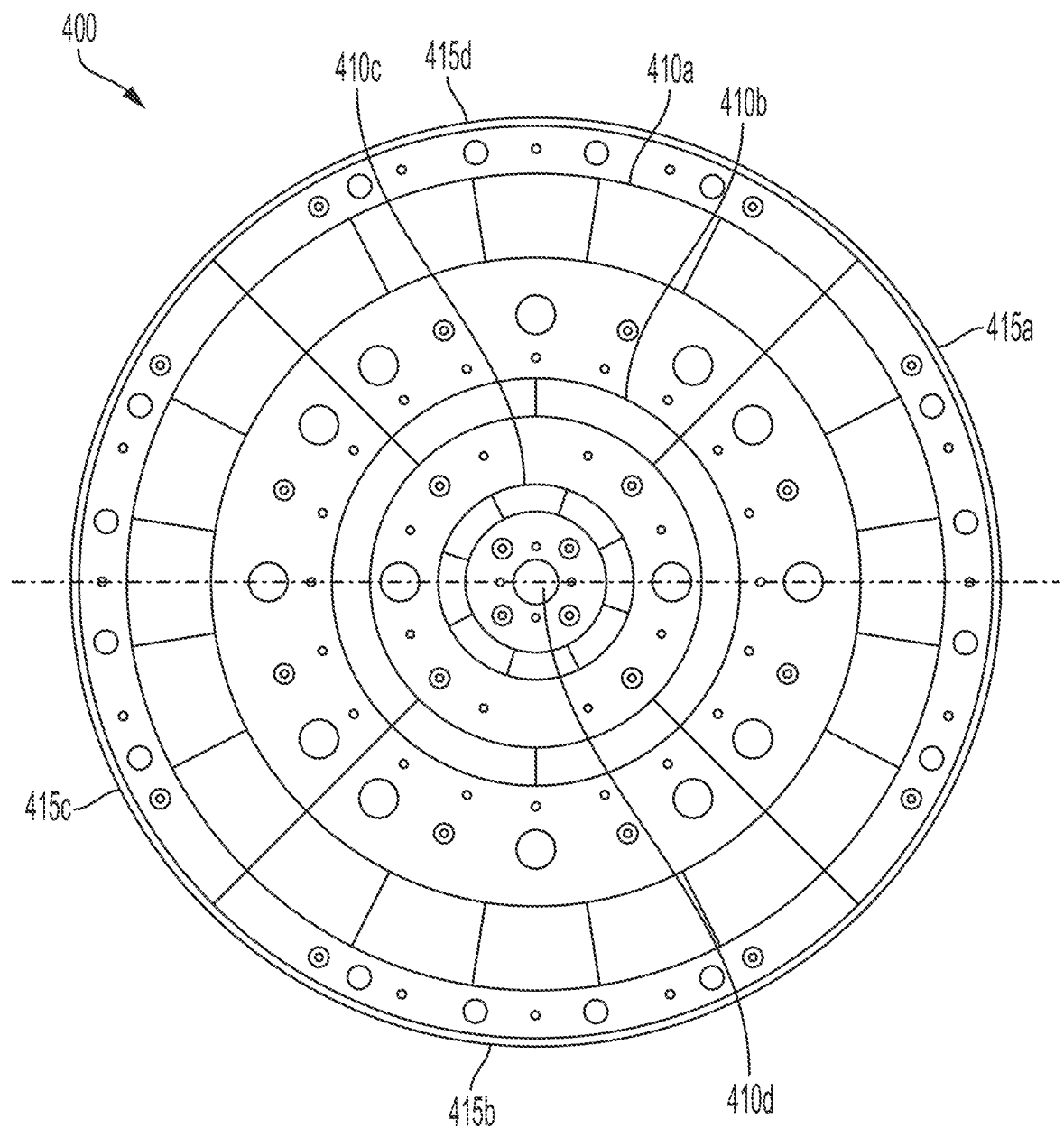
FIG. 4 illustrates a top view of an exemplary configuration of permanent magnet rings forming, in part, the $B_0$ magnet illustrated in FIG. 3.

FIG. 4 illustrates a top-down view of a permanent magnet 410, which may, for example, be used as the design for permanent magnets 410*a* and 410*b* of $B_0$ magnet 300 illustrated in FIG. 3. Permanent magnet 410 comprises concentric rings 410*a*, 1410*b*, and 410*c*, each constructed of a plurality of circular arc segments of ferromagnetic material, and a ferromagnetic disk 410*d* at the center. In embodiments in which the yoke is not symmetric (e.g., yoke 320), the yoke will cause the magnetic field produced by the permanent magnets for which it captures and focuses magnetic flux to be asymmetric as well, negatively impacting the uniformity of the $B_0$ magnetic field. According to some embodiments, one or more dimensions of the circular arc segments are varied to compensate for the effects of the yoke on the magnetic field produced by the permanent magnet. For example, one or more dimensions of circular arc segments in the four quadrants 415*a*, 415*b*, 415*c* and 415*d* labeled in FIG. 4 may be varied to compensate for the effects of the yoke on the $B_0$ magnetic field, as discussed in further detail below.

Figure 5A:
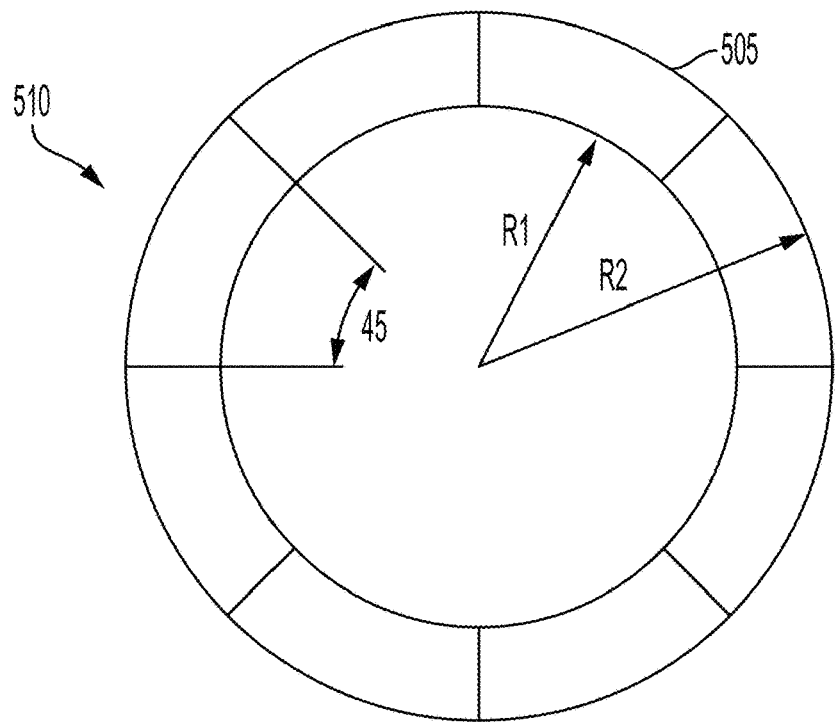
FIGS. 5A and 5B illustrate an exemplary ring of permanent magnet segments for a $B_0$ magnet, in accordance with some embodiments.
Figure 5B:
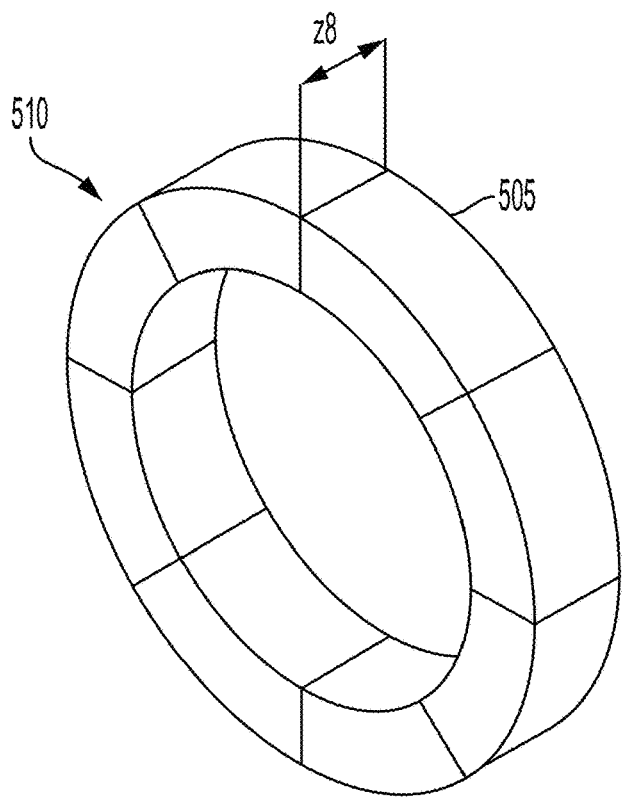

FIGS. 5A and 5B illustrate different views of an inner ring 510 (e.g., ring 410*c* illustrated in FIG. 4), in accordance with some embodiments. Exemplary ring 510 includes a plurality (eight in exemplary ring 510 illustrated in FIGS. 5A and 5B) of ferromagnetic circular arc segments (e.g., segments formed of NdFeB, SmCo, etc.), each spanning 45° of the ring. In exemplary ring 510, the circular arc segments (e.g., exemplary circular arc segment 505) are dimensioned so as to provide a ring with inner radius R1 and outer radius R2 and a height or depth $z_8$. According to some embodiments, inner ring 510 has dimensions of R1 between 45-47 mm (e.g., 46.08 mm), R2 between 62-64 mm (e.g., 62.91 mm) and $z_8$ between 22 and 25 mm (e.g., 23.46 mm). It should be appreciated that the number of circular arc segments and the dimensions thereof may be chosen as desired to produce a desired $B_0$ magnetic field (e.g., a desired field strength and/or homogeneity), as the aspects are not limited in this respect.

Figure 5E:
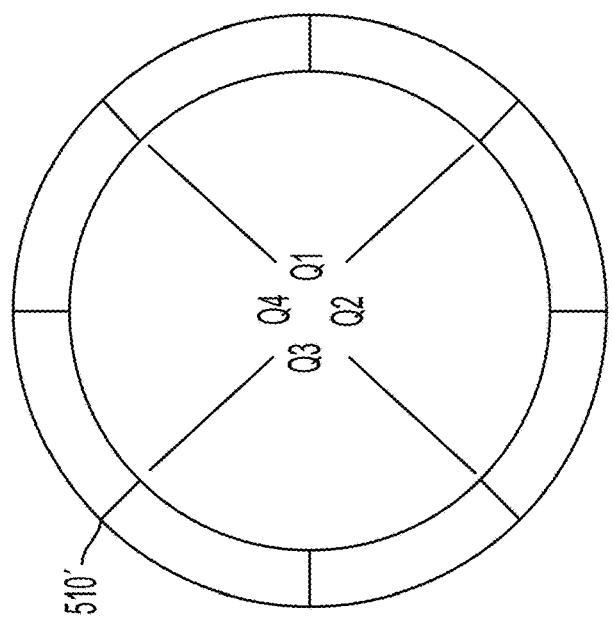
FIG. 5E illustrates a permanent magnet ring for a $B_0$ magnet, in accordance with some embodiments.
Figure 5D:
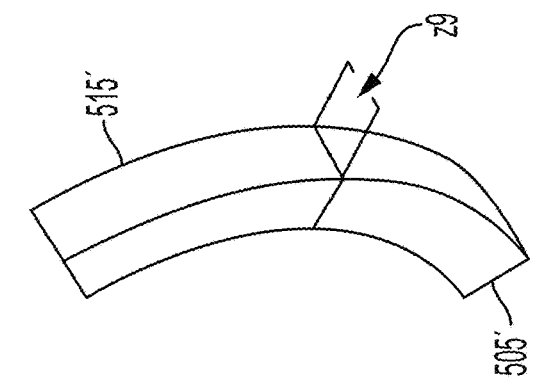
FIGS. 5C and 5D illustrate different views of permanent magnet segments that can be used to form the permanent magnet ring illustrated in FIG. 5E, in accordance with some embodiments.
Figure 5C:
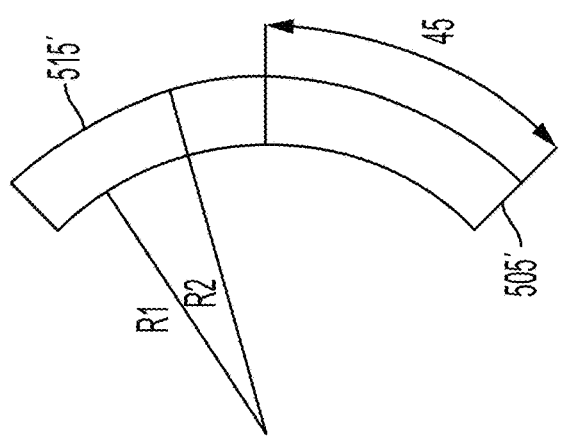

FIGS. 5C and 5D illustrate different views of a segment 515 that can be used to form middle ring 510 illustrated in FIG. 5E (e.g., ring 410*b* illustrated in FIG. 4). For example, segment 515 can be used to provide the segments in quadrants Q1-Q4 as illustrated in FIG. 5E (also, e.g., segments in quadrants 415*a-d* of ring 410*b* illustrated in FIG. 4). Exemplary portion 1815' includes a plurality of ferromagnetic circular arc segments (e.g., segments formed of NdFeB, SmCo, etc.), In FIGS. 5C-5E, two circular arc segments (e.g., exemplary circular arc segment 505'), each spanning 45°, form a quadrant of ring 510'. In exemplary portion 515' of ring 510', the circular arc segments are dimensioned so as to provide a ring with inner radius R1 and outer radius R2 and a height or depth $z_9$, which dimensions can be chosen for each quadrant to achieve a desired magnetic field, non-limiting examples of which are provided below.

Figure 5H:
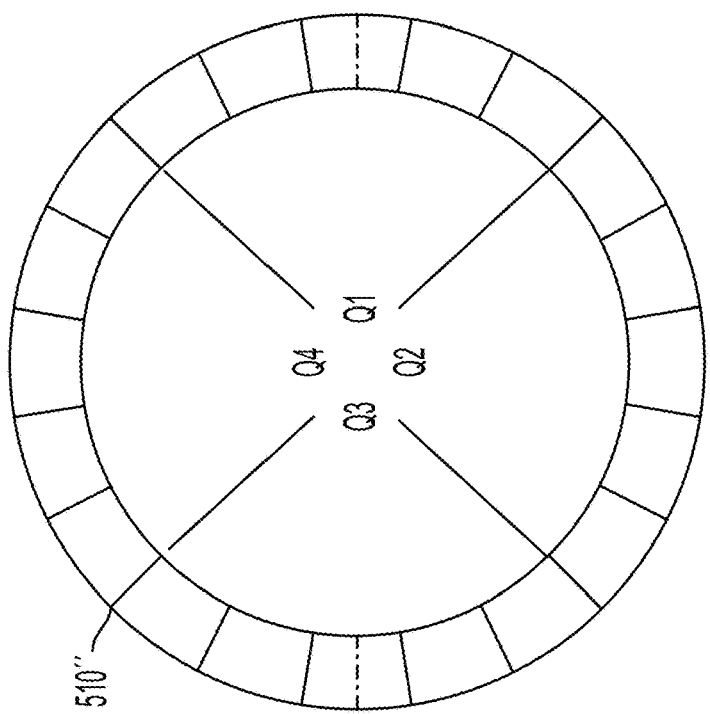
FIG. 5H illustrates a permanent magnet ring for a $B_0$ magnet, in accordance with some embodiments.
Figure 5G:
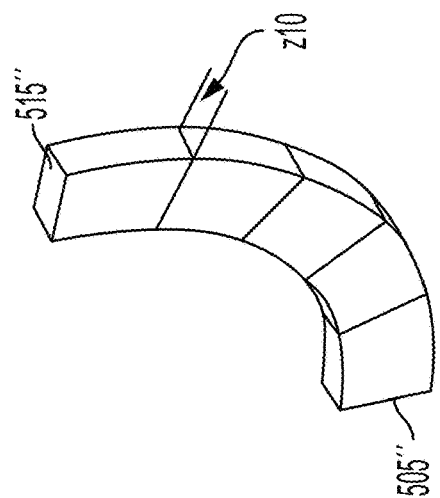
FIGS. 5F and 5G illustrate different views of permanent magnet segments that can be used to form the permanent magnet ring illustrated in FIG. 5H, in accordance with some embodiments.
Figure 5F:
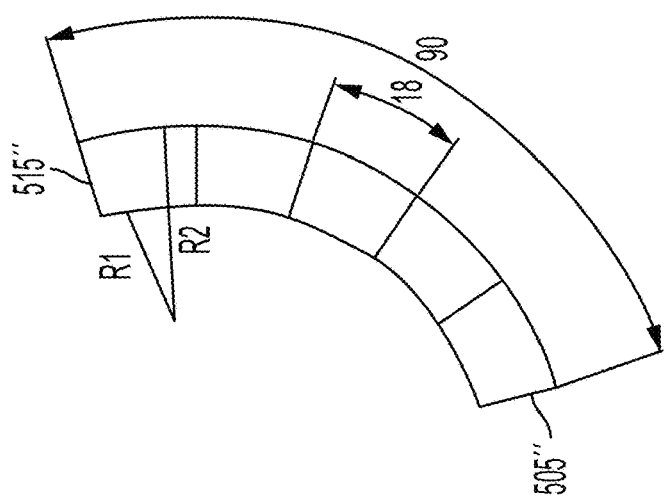

FIGS. 5F and 5G illustrate different views of a segment 515 that can be used to form outer ring 510" illustrated in FIG. 5H (e.g., ring 410*a* illustrated in FIG. 4). For example, segment 515" can be used to provide the segments in quadrants Q1-Q4 as illustrated in FIG. 5H (also, e.g., segments in quadrants 415*a-d* of ring 410*a* illustrated in FIG. 4). Exemplary portion 515" includes a plurality of ferromagnetic circular arc segments (e.g., segments formed of NdFeB, SmCo, etc.). In FIGS. 5F-5H, five circular arc segments (e.g., exemplary circular arc segment 505"), each spanning 18° of ring 510", form a quadrant of ring 510". In exemplary segment 515 of ring 510", the circular arc segments are dimensioned so as to provide a ring with inner radius R1 and outer radius R2 and a height or depth $z_{10}$, which dimensions can be chosen for each quadrant to achieve a desired magnetic field.

As discussed above, the inventors have developed low power, portable low-field MRI systems that can be deployed in virtually any environment and that can be brought to the patient who will undergo an imaging procedure. In this way, patients in emergency rooms, intensive care units, operating rooms and a host of other locations can benefit from MRI in circumstances where MRI is conventionally unavailable. Aspects that facilitate portable MRI are discussed in further detail below.

Figure 6B:
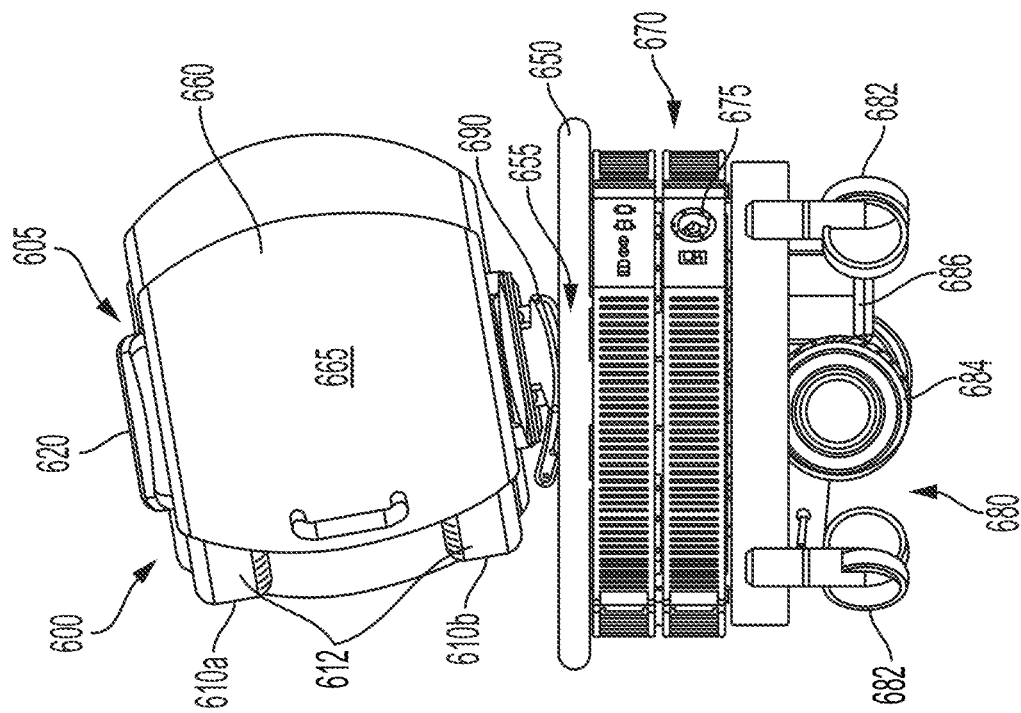
FIGS. 6A and 6B illustrate a portable low-field MRI system, in accordance with some embodiments.
Figure 6A:
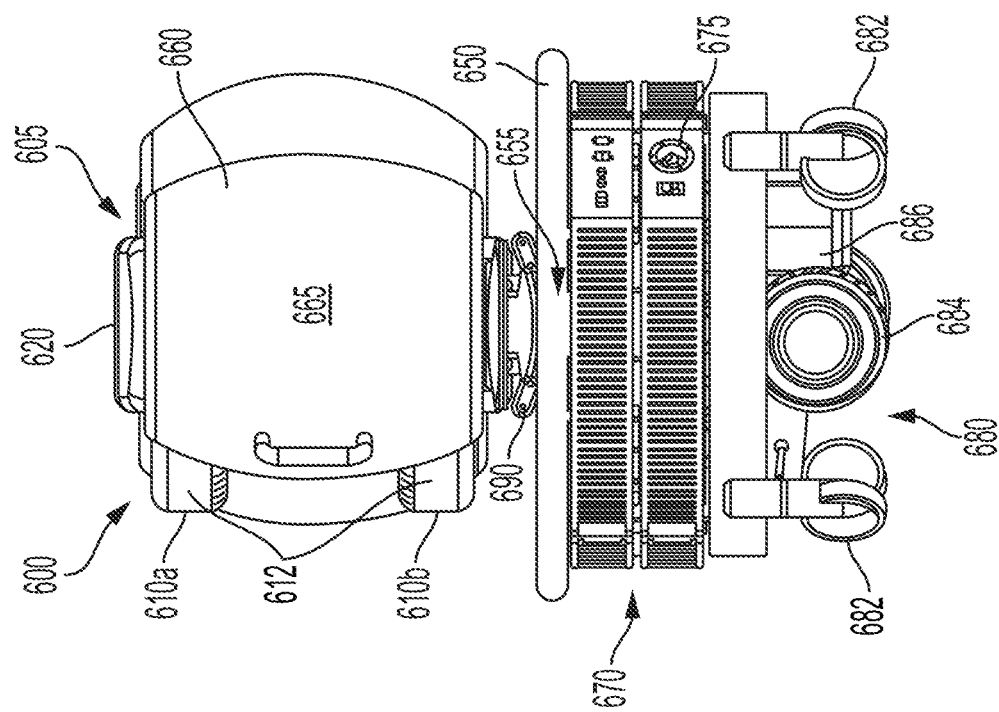

FIGS. 6A and 6B illustrate a low power, portable low-field MRI system, in accordance with some embodiments. Portable MRI system 600 comprises a $B_0$ magnet 605 including at least one first permanent magnet 610*a* and at least one second permanent magnet 610*b* magnetically coupled to one another by a ferromagnetic yoke 620 configured to capture and channel magnetic flux to increase the magnetic flux density within the imaging region (field of view) of the MRI system. Permanent magnets 610*a* and 610*b* may be constructed using any suitable technique, including any of the techniques described herein (e.g., using any of the techniques, designs and/or materials described in connection with $B_0$ magnet 200 illustrated in FIG. 2A and/or $B_0$ magnet 300 illustrated in FIG. 3 and described in the accompanying description thereof). Yoke 620 may also be constructed using any of the techniques described herein (e.g., using any of the techniques, designs and/or materials described in connection with yokes 220 and 420 illustrated in FIG. 2A and FIG. 3 and described in the accompanying description thereof). It should be appreciated that, in some embodiments, $B_0$ magnet 605 may be formed using electromagnets using any of the electromagnet techniques described herein. $B_0$ magnet 605 may be encased or enclosed in a housing 612 along with one or more other magnetics components, such as the system's gradient coils (e.g., x-gradient, y-gradient and z-gradient coils) and/or any shim components (e.g., shim coils or permanent magnetic shims), $B_0$ correction coils, etc.

$B_0$ magnet 605 may be coupled to or otherwise attached or mounted to base 650 by a positioning mechanism 690, such as a goniometric stage, so that the $B_0$ magnet can be tilted (e.g., rotated about its center of mass) to provide an incline to accommodate a patient's anatomy as needed. In FIG. 6A, the $B_0$ magnet is shown level without an incline and, in FIG. 6B, the $B_0$ magnet is shown after undergoing a rotation to incline the surface supporting the patient's anatomy being scanned. Positioning mechanism 690 may be fixed to one or more load bearing structures of base 650 arranged to support the weight of $B_0$ magnet 600.

In addition to providing the load bearing structures for supporting the $B_0$ magnet, base 650 also includes an interior space configured to house the electronics 670 needed to operate the portable MRI system 600. For example, base 650 may house the power components to operate the gradient coils (e.g., X, Y and Z) and the RF transmit/receive coils. The inventors have developed generally low power, low noise and low cost gradient amplifiers configured to suitably power gradient coils in the low-field regime, designed to be relatively low cost, and constructed for mounting within the base of the portable MRI system (i.e., instead of being statically racked in a separate room of a fixed installment as is conventionally done). Examples of suitable power components to operate the gradient coils are described in further detail below (e.g., the power components described in connection with FIG. 1 and FIG. 20). According to some embodiments, the power electronics for powering the gradient coils of an MRI system consume less than 50 W when the system is idle and between 100-300 W when the MRI system is operating (i.e., during image acquisition). Base 650 may also house the RF coil amplifiers (i.e., power amplifiers to operate the transmit/receive coils of the system), power supplies, console, power distribution unit and other electronics needed to operate the MRI system, further details of which are described below.

According to some embodiments, the electronics 670 needed to operate portable MRI system 600 consume less than 1 kW of power, in some embodiments, less than 750 W of power and, in some embodiments, less than 500 W of power (e.g., MRI systems utilizing a permanent $B_0$ magnet solution). Techniques for facilitating low power operation of an MRI device are discussed in further detail below. However, systems that consume greater power may also be utilized as well, as the aspects are not limited in this respect. Exemplary portable MRI system 600 illustrated in FIGS. 6A and 6B may be powered via a single power connection 675 configured to connect to a source of mains electricity, such as an outlet providing single-phase power (e.g., a standard or large appliance outlet). Accordingly, the portable MRI system can be plugged into a single available power outlet and operated therefrom, eliminating the need for a dedicated power source (e.g., eliminating the need for a dedicated three-phase power source as well as eliminating the need for further power conversion electronics to convert three phase power to single phase power to be distributed to corresponding components of the MRI system) and increasing the availability of the MRI system and the circumstances and locations in which the portable MRI system may be used.

Portable MRI system 600 illustrated in FIGS. 6A and 6B also comprises a conveyance mechanism 680 that allows the portable MRI system to be transported to different locations. The conveyance mechanism may comprise one or more components configured to facilitate movement of the portable MRI system, for example, to a location at which MRI is needed. According to some embodiments, conveyance mechanism comprises a motor 686 coupled to drive wheels 684. In this manner, conveyance mechanism 680 provides motorized assistance in transporting MRI system 600 to desired locations. Conveyance mechanism 680 may also include a plurality of castors 682 to assist with support and stability as well as facilitating transport.

According to some embodiments, conveyance mechanism 680 includes motorized assistance controlled using a controller (e.g., a joystick or other controller that can be manipulated by a person) to guide the portable MRI system during transportation to desired locations. According to some embodiments, the conveyance mechanism comprises power assist means configured to detect when force is applied to the MRI system and to, in response, engage the conveyance mechanism to provide motorized assistance in the direction of the detected force. For example, rail 655 of base 650 illustrated in FIGS. 6A and 6B may be configured to detect when force is applied to the rail (e.g., by personnel pushing on the rail) and engage the conveyance mechanism to provide motorized assistance to drive the wheels in the direction of the applied force. As a result, a user can guide the portable MRI system with the assistance of the conveyance mechanism that responds to the direction of force applied by the user. The power assist mechanism may also provide a safety mechanism for collisions. In particular, the force of contact with another object (e.g., a wall, bed or other structure) may also be detected and the conveyance mechanism will react accordingly with a motorized locomotion response away from the object. According to some embodiments, motorized assistance may be eliminated and the portable MRI system may be transported by having personnel move the system to desired locations using manual force.

Portable MRI system 600 includes slides 660 that provide electromagnetic shielding to the imaging region of the system. Slides 660 may be transparent or translucent to preserve the feeling of openness of the MRI system to assist patients who may experience claustrophobia during conventional MRI performed within a closed bore. Slides 660 may also be perforated to allow air flow to increase the sense of openness and/or to dissipate acoustic noise generated by the MRI system during operation. The slides may have shielding 665 incorporated therein to block electromagnetic noise from reaching the imaging region. According to some embodiments, slides 660 may also be formed by a conductive mesh providing shielding 665 to the imaging region and promoting a sense of openness for the system. Thus, slides 660 may provide electromagnetic shielding that is moveable to allow a patient to be positioned within the system, permitting adjustment by personnel once a patient is positioned or during acquisition, and/or enabling a surgeon to gain access to the patient, etc. Thus, the moveable shielding facilitates flexibility that allows the portable MRI system to not only be utilized in unshielded rooms, but enables procedures to be performed that are otherwise unavailable. Exemplary slides providing varying levels of electromagnetic shielding are discussed in further detail below.

According to some embodiments, a portable MRI system does not include slides, providing for a substantially open imaging region, facilitating easier placement of a patient within the system, reducing the feeling of claustrophobia and/or improving access to the patient positioned within the MRI system (e.g., allowing a physician or surgeon to access the patient before, during or after an imaging procedure without having to remove the patient from the system). The inventors have developed techniques that facilitate performing MRI with varying levels of electromagnetic shielding, including no or substantially no shielding of the imaging region, including a noise suppression system adapted to suppress electromagnetic noise in the environment. According to some embodiments, portable MRI system 600 may be equipped with a noise reduction system using one or more of the noise suppression and/or avoidance techniques described herein to, for example, dynamically adapt the noise suppression/cancellation response in concert with the shielding configuration of a given shielding arrangement of the portable MRI system 600. Thus, portable low field MRI system 600 can be transported to the patient and/or to a desired location and operated outside specially shielded rooms (e.g., in an emergency room, operating room, NICU, general practitioner's office, clinic) and/or brought bedside directly to the patient wherever located, allowing for MRI to be performed when and where it is needed. To facilitate portable MRI that can be operated in virtually any location, the inventors have developed low power MRI systems that, in accordance with some embodiments, are configured to be powered by main electricity (e.g., single-phase electric power from standard or industrial wall outlets), as discussed in further detail below.

As discussed above, conventional MRI systems consume significant power, requiring dedicated three-phase power sources to operate. In particular, conventional MRI systems that use superconducting material to form the $B_0$ magnet require cryogenic cooling systems that consume substantial power to keep the conductors in a superconducting state. In addition, the power amplifiers used to operate the gradient amplifiers are large power components that draw large amounts of power and are typically stored in a separate room that houses the electronic components of the system. Moreover, power components configured to operate the transmit/receive coil systems of conventional MRI system also consume significant amounts of power. Many conventional high field MRI systems are require HVAC systems that also draw substantial amounts of power.

Conventional MRI systems are fixed installments requiring a specialized and dedicated spaces. As a result, the requirement of a dedicated three-phase power connection to operate the MRI system is not a critical limitation for these systems, as it is just one of a number of dedicated and specialized features of a conventional MRI installment. However, requiring a dedicated three-phase power source places significant restrictions on locations at which a portable MRI system can be operated. Accordingly, the inventors have developed a low power MRI system that facilitates portability of the MRI system. For example, in accordance with some embodiments, a low power MRI system is configured to operate using mains power (e.g., single phase electric power from a standard or industrial outlet). Exemplary aspects of a low power MRI system are discussed in further detail below.

According to some embodiments, a low power MRI system comprises a permanent $B_0$ magnet (e.g., any of the permanent magnets discussed herein such as those illustrated in FIGS. 2A and 3). Because a permanent $B_0$ magnet, once magnetized, will produce its own persistent magnetic field, power is not required to operate the permanent $B_0$ magnet to generate its magnetic field. As a result, a significant (often dominant) contributor to the overall power consumption of an MRI system can be eliminated, facilitating the development of an MRI system that can be powered using mains electricity (e.g., via a standard wall outlet or common large household appliance outlets), as discussed in further detail below in connection with exemplary low power MRI systems.

Furthermore, conventional power components adapted to operate a gradient coil system are generally unsuitable for use in low-field MRI due, at least in part, to expense and noise levels and are unsuitable for low power and/or portable MRI due to power consumption, size and weight. For example, while the cost of conventional power components used to operate gradient coils in currently available MRI systems may be acceptable given the relative insignificance compared to the total cost of a high-field MRI installation, this cost may be unacceptably high in the context of a low-field MRI system that is designed as a lower cost alternative. Thus, the cost of a power component conventionally used for high-field MRI may be disproportionately large and therefore not satisfactory for some lower cost low-field MRI systems.

Additionally, the relatively low SNR in the low-field (and particularly in the very-low and ultra-low-field regimes) renders conventional gradient coil power components unsuitable. In particular, conventional power components for driving gradient coils are generally unsuitable for low-field MRI systems because they are not designed to drive the coils with sufficiently low noise. Although the noise injected by such power components may be acceptable in the high SNR regime of high-field MRI systems, such components generally do not provide a sufficiently low level of noise to provide acceptable image quality in a low-field MRI system. For example, conventional power components may exhibit unsatisfactory variation in the output (e.g., ripple) for use in the low-field context, injecting relatively significant noise into the gradient coil system of a low-field MRI system.

Moreover, conventional power components configured to drive the gradient coil system of currently available MRI systems are not designed to be power efficient, consuming large amounts of power. In addition, conventional power components configured to operate the gradient coil system of currently available MRI systems are large, heavy devices, typically racked in a separate room adjacent the MRI device along with the other electronic components. Thus, conventional gradient power components are not suitable for use in a low power, portable MRI system.

Figure 7:
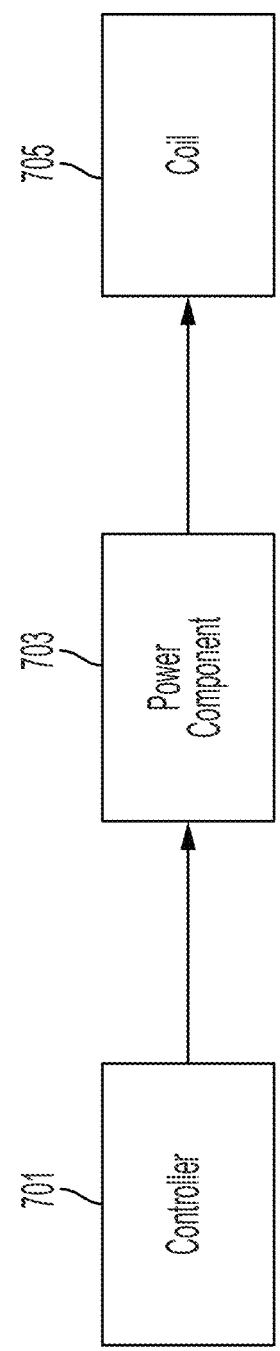
FIG. 7 shows drive circuitry for driving a current through a coil to produce a magnetic field, in accordance with some embodiments of the technology described herein.

FIG. 7 illustrates drive circuitry for driving a current through a coil 705 of an MRI system to produce a magnetic field in accordance with a desired pulse sequence, according to some embodiments. Power component 703 drives a current through coil 705 based on a control signal from the controller 701. The controller 701 may produce a control signal to drive power component 703 based on a pulse sequence implemented by controller 701 (or provided by one or more other controllers), as discussed above. In some embodiments, coil 705 may be a gradient coil 128. However, the techniques described herein are not limited in this respect, as coil 705 may be a coil of magnet 122, shim coil 124, or an RF transmit and/or receive coil 126. In some embodiments, controller 701 may correspond to controller 106 of FIG. 1 and drive power component 703 may correspond to power component 114 of FIG. 1.

Power components configured to power gradient coils typically provide relatively high power and typically need to provide precise control over the current provided to the gradient coil so that the desired pulse sequence can be delivered faithfully. Inaccuracies in delivering the commanded current to the gradient coil results in a decrease in signal-to-noise ratio due to differences between the gradient pulse sequence being delivered and the intended (and expected) pulse sequence. Power components configured to drive gradient coils also should to be responsive in delivering the commanded current to the gradient coil, including rapid transition between commanded current levels so as to faithfully produce the current waveforms required by the desired pulse sequences. Accordingly, the inventors have developed power components capable of being controlled to accurately and precisely provide current, with relatively low noise and relatively high efficiency, to one or more gradient coils to faithfully reproduce a desired pulse sequence, some embodiments of which are discussed in further detail below.

In some embodiments, the power component 703 may be a "current mode" power component that drives a desired current through coil 705. The desired current may be produced by power component 703 in response to a current command from controller 701. In this respect, the power component 703 may operate as a current source that is controlled by the current command (which may be provided by the controller as a voltage level indicating the current to be provided to coil 705). Controller 701 may change the current command such that power component 703 produces current values that change in accordance with a selected pulse sequence. For example, controller 701 may command the power component to drive one or more gradient coils in accordance with a pulse sequence comprising a plurality of gradient pulses. For each gradient pulse, the power component may need to ramp up the current provided to a corresponding gradient coil at the rising edge of the gradient pulse and ramp down the current provided to the gradient coil at a falling edge of the gradient pulse. Example operation of a power component configured to drive the gradient coil to provide a plurality of such gradient pulses is described in further detail below.

Figure 8:
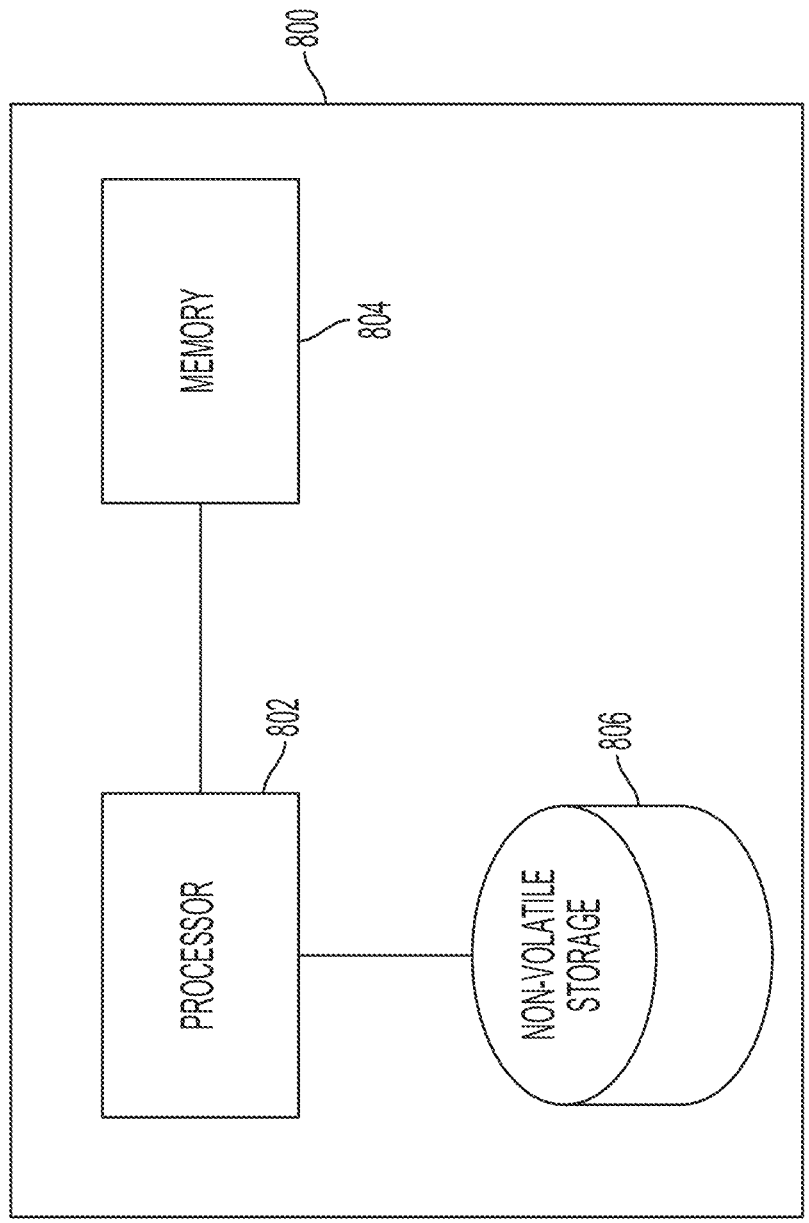
FIG. 8 illustrates a computer system, in accordance with some embodiments.

FIG. 8 is a diagram of an illustrative computer system on which embodiments described herein may be implemented. For example, the method for measuring hysteresis effects in an MRI system (see, e.g., FIG. 16 below), and the method for controlling a gradient coil of an MRI system (see, e.g., FIG. 17 below) may be implemented on and/or using computer system 800. The computer system 800 may include one or more computer hardware processors 802 and one or more articles of manufacture that comprise non-transitory computer-readable storage media (e.g., memory 804 and one or more non-volatile storage media 806). The processor 802 may control writing data to and reading data from the memory 804 and the non-volatile storage device 806 in any suitable manner, as the aspects of the disclosure provided herein are not limited in this respect. To perform any of the functionality described herein, the processor 802 may execute one or more processor-executable instructions stored in one or more non-transitory computer-readable storage media (e.g., the memory 804), which may serve as non-transitory computer-readable storage media storing processor-executable instructions for execution by the processor 802.

Figure 9B:
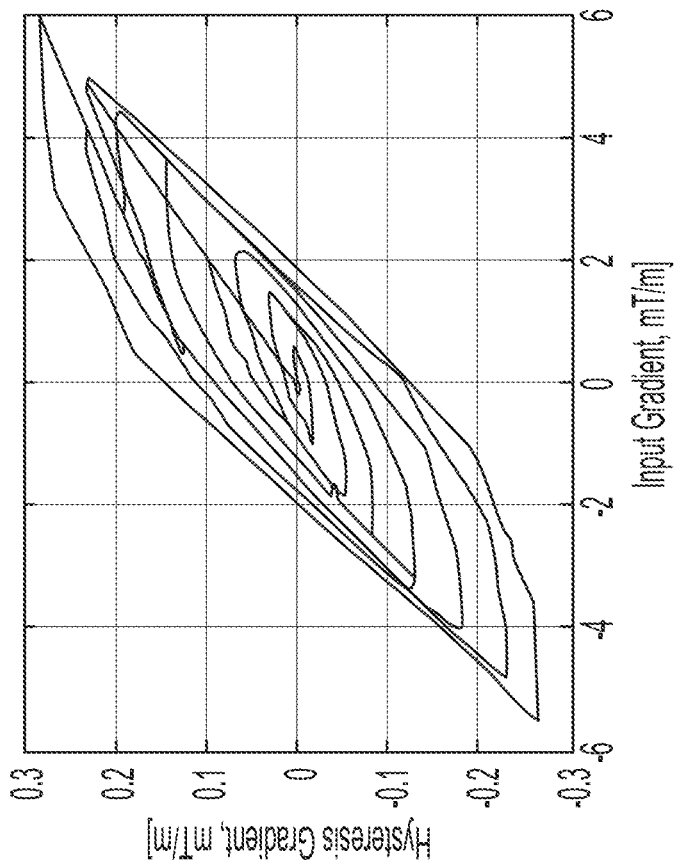
FIG. 9B illustrates a measured hysteresis curve, in accordance with some embodiments.
Figure 9A:
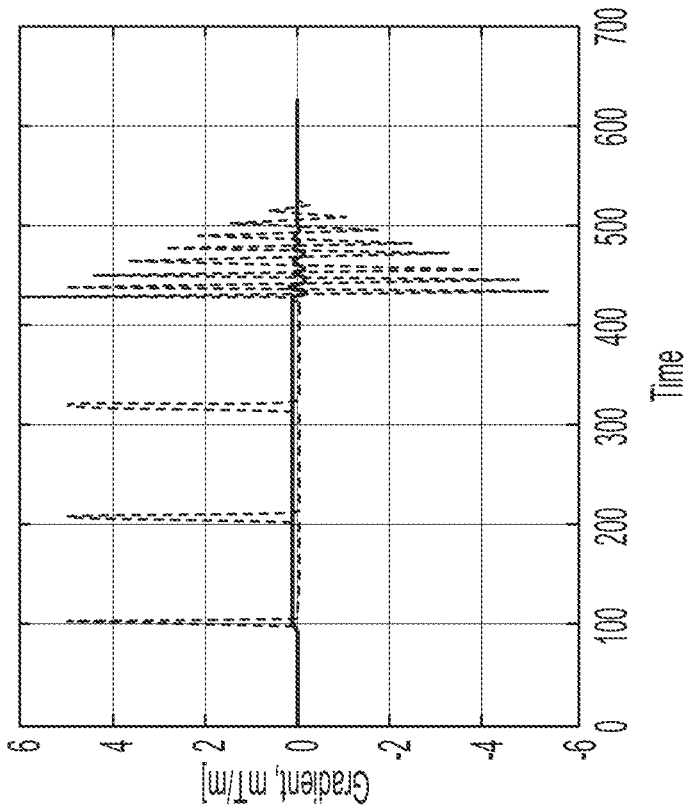
FIG. 9A illustrates a gradient pulse sequence, in accordance with some embodiments.

FIG. 9A illustrates an example gradient pulse sequence that may be used by an MRI system to control one or more gradient coils and generate a magnetic field in the imaging region of the MRI system. The dashed line in FIG. 9A represents an idealized gradient pulse sequence as a function of time. The pulse sequence causes the gradient coils to create a magnetic field that oscillates from a maximum value to a minimum value while the maximum and minimum values of the oscillation decay over time. The varying magnetic field results in an induced magnetization of components of the MRI system. The solid line in FIG. 9A represents the resulting gradient hysteresis (i.e., induced magnetization) as a function of time The induced magnetization creates its own magnetic field in the imaging region that is superimposed with the magnetic field created by the gradient coils resulting in a hysteresis effect that is illustrated in FIG. 9B, which plots the hysteresis gradient field (i.e., the gradient field generated by the induced magnetization) as a function of the gradient field strength generated by the gradient coil over the course of the decaying oscillating pulse sequence. As can be seen from the plot of the hysteresis effect in FIG. 9B, the magnitude of the hysteresis effect depends on the strength of the magnetic field generated by the gradient coils of the MRI system and whether the magnetic field generated by the gradient coils is increasing or decreasing.

The hysteresis effects in a system such as an MRI system may be measured and modeled using, for example, a Preisach model, which uses a weighting function to characterize the magnetic properties of the a material. Details of Preisach models and determining the weighting function are described in "Difficult in identification of Preisach hysteresis model weighting function using first order reversal curves method in soft magnetic materials," Applied Mathematics and Computation Vol. 319, pages 469-485 (15 Feb. 2018), http://dx.doi.org/10.1016/j.amc.2017.05.017, which is incorporated herein by reference in its entirety. In the case of applying a Preisach model to an MRI system, the magnetic properties of the MRI system as a whole are characterized and may include characterization of the yoke, the electronics, the housing, or any other ferromagnetic material in the vicinity of the MRI system.

Figures 10A, 10B:
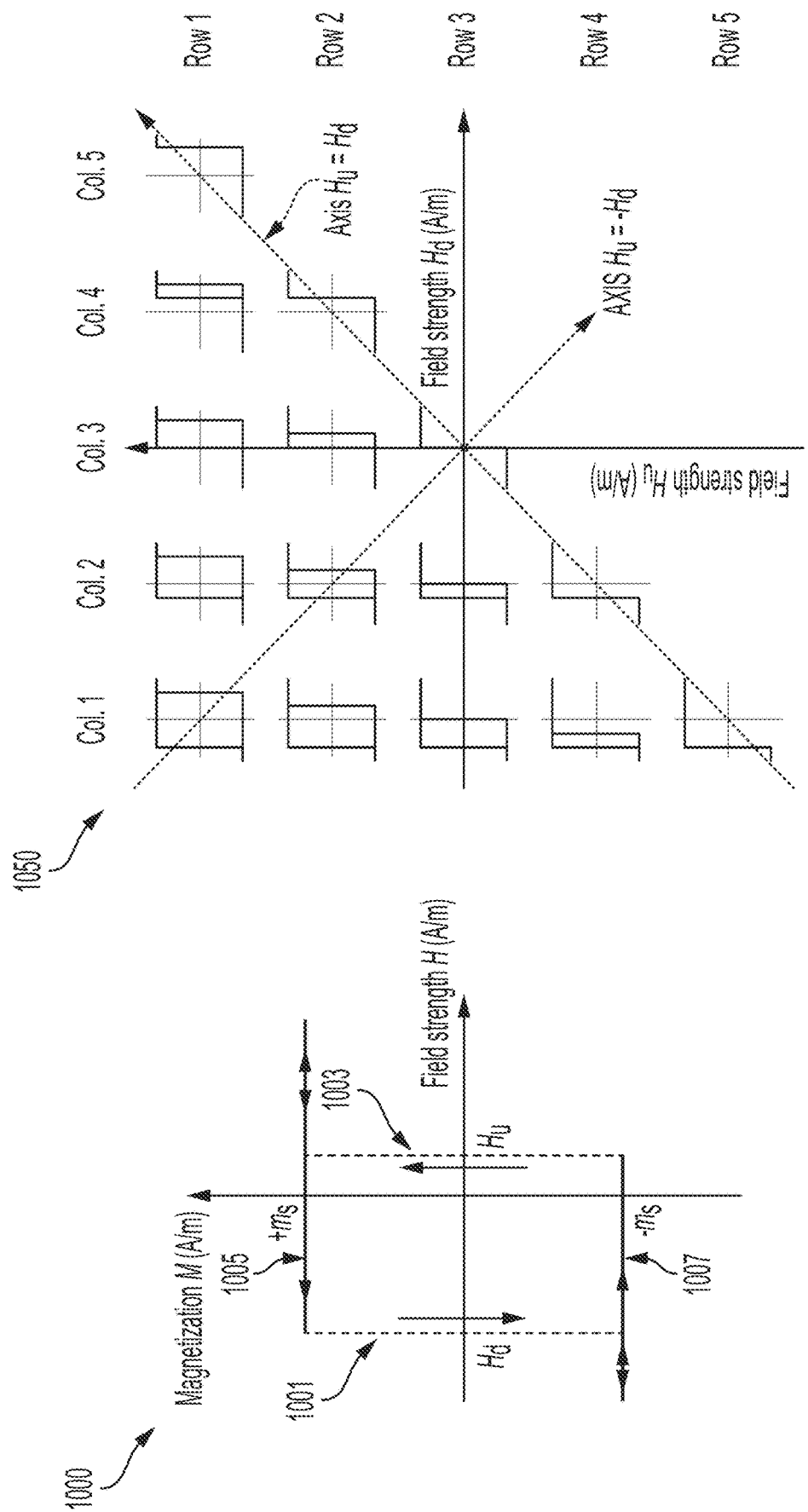
FIG. 10A illustrates a hysteron model of a magnetic particle, according to some embodiments.
FIG. 10B illustrates a Preisach model of hysteresis effects based on multiple hysteron models, according to some embodiments.

A Preisach model uses models the hysteresis effects of the MRI system using a model of an ideal dipole with a rectangular hysteresis loop, known as a "hysteron." FIG. 10A illustrates a hysteron, according to some embodiments. A hysteron has three parameters that characterize the hysteresis loop 2300: a lower magnetic field strength value 1001 ($H_d$), an upper magnetic field strength value 1003 ($H_u$), and a dipole momentum value ($m_s$), which defines the upper magnetization value 1005 and lower magnetization value 1007 of the hysteresis loop 1000. When an external magnetic field is increased and becomes greater than the upper magnetic field strength value 1003, the dipole magnetic momentum switches to the upper magnetization value 1005. Similarly, when an external magnetic field is decreased and becomes less than the lower magnetic field strength value 1001, the dipole magnetic momentum switches to the lower magnetization value 1007. When the external magnetic field strength is between lower magnetic field strength value 1001 and the upper magnetic field strength value 1003, the state of the dipole magnetic momentum is dependent on the previous state.

The Preisach model uses a plurality of hysterons arranged in a two-dimensional array of hysterons, where each hysteron in a particular row of the array has the same upper magnetic field strength value 1003 and each hysteron in a particular column of the array has the same lower magnetic field strength value 1001. FIG. 10B illustrates a schematic of a simplified Preisach model 1050 that includes five rows and five columns. It should be appreciated that Preisach models used in some embodiments may have any number of rows and columns. For example, some embodiments may include tens, hundreds or thousands of rows and columns. As illustrated in FIG. 10B, the hysterons in the first column all have the same lower magnetic field strength value 1001. The hysterons in the second column also have the same lower magnetic field strength value 1001 as each other, but a higher lower magnetic field strength value 1001 than that of column 1. Similarly, as you move to the right in the Preisach model 1050 to the higher number columns, the lower magnetic field strength value 1001 increases. In a similar way, the hysterons in the first row all have the same upper magnetic field strength value 1003. The hysterons in the second row also have the same upper magnetic field strength value 1003 as each other, but a smaller upper magnetic field strength value 1003 than that of row 1. Similarly, as you move down the Preisach model 1050 to the higher number rows, the upper magnetic field strength value 1003 decreases.

The Preisach model 1050 is a two-dimensional array that is triangular in shape. There are no hysterons in the lower-right-hand portion of the model because such hysterons would correspond to physically unrealizable hysteresis loops because the upper magnetic field strength value 1003 must be larger than the lower magnetic field strength value 1001. The hysterons along the diagonal line along the bottom of the triangular shape correspond to hysterons with the lower magnetic field strength value 1001 equal to the upper magnetic field strength value 1003.

Using the Preisach model 1050, the magnetization of the MRI system may be determined using the following equation:

$$M(t) = \iint_{H_u \geq H_d} W(H_u, H_d) \dot{m}(H_u, H_d) H(t) dH_u dH_d$$

where H(t) is the externally applied magnetic field strength from, e.g., a gradient coil and $\dot{m}(H_u, H_d)$ is a hysteresis operator that acts on the external magnetic field H(t) resulting in the value $+m_s$ or $-m_s$, depending on the values of $H_u$ and $H_d$ and the direction of change of H(t), e.g., whether the external magnetic field is increasing or decreasing. The weighting function $w(H_u, H_d)$ specifies the value of the elementary magnetic momentum of the MRI system and is determined by making measurements of the hysteresis of the MRI system, in accordance with some embodiments. Thus, the Preisach model of the MRI system has a state at any given time based on the current value of the externally applied magnetic field and the history of the applied magnetic field (e.g., as represented by the previous state of the Preisach model). Thus, as the externally applied magnetic field changes in value, the state of the Preisach model also changes.

Figure 11A:
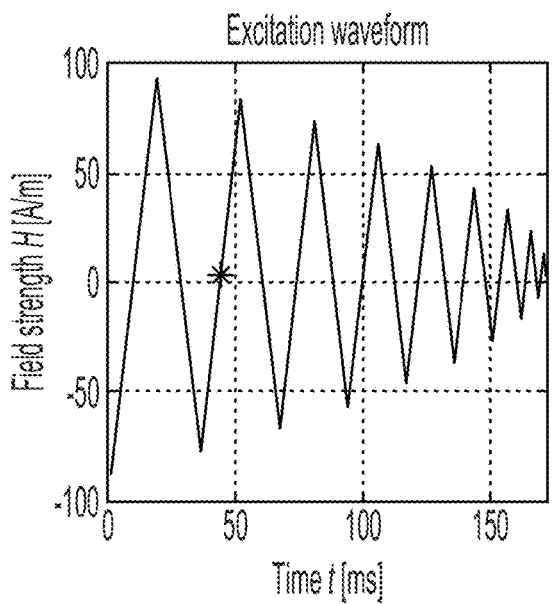
FIG. 11A illustrates an example time dependent applied magnetic field, in accordance with some embodiments.
Figure 11B:
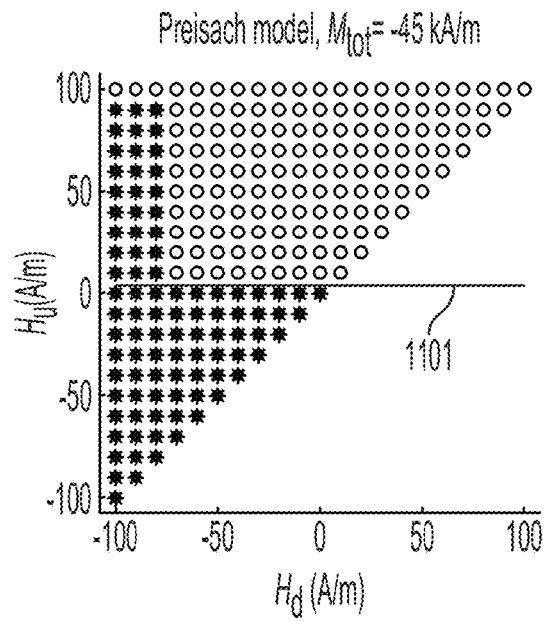
FIG. 11B illustrates application of a Preisach model, in accordance with some embodiments.
Figure 11C:
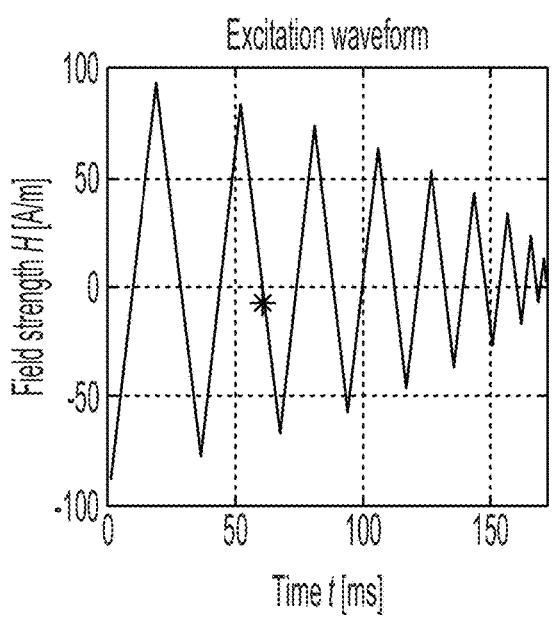
FIG. 11C illustrates an example time dependent applied magnetic field, in accordance with some embodiments.

The dynamics of the Preisach model may be illustrated using a time dependent external magnetic field, as shown in FIGS. 11A and 11C, which illustrate a magnetic field that changes linearly, but oscillates between a high value and a low value, the high value and the low value decreasing in magnitude over time. The asterisk in FIG. 11A illustrates the current value of the external magnetic field after being switched on some time before and currently increasing in magnitude. FIG. 11B illustrates the state of the Preisach model at this particular time. The hysterons polarized upwards are illustrated as filled circles, whereas the empty circles represent hysterons with downwards polarization. The instantaneous external field strength is illustrated in FIG. 11B by the horizontal line 1101. As time progresses, the horizontal line 1101 moves from the bottom of the array of hysterons to the top. The hysterons beneath the current level of the horizontal line 1101 are in a upward polarization configuration. The hysterons above the current level of the horizontal line 1101 remain unchanged relative to the previous state of the Preisach model.

Figure 11D:
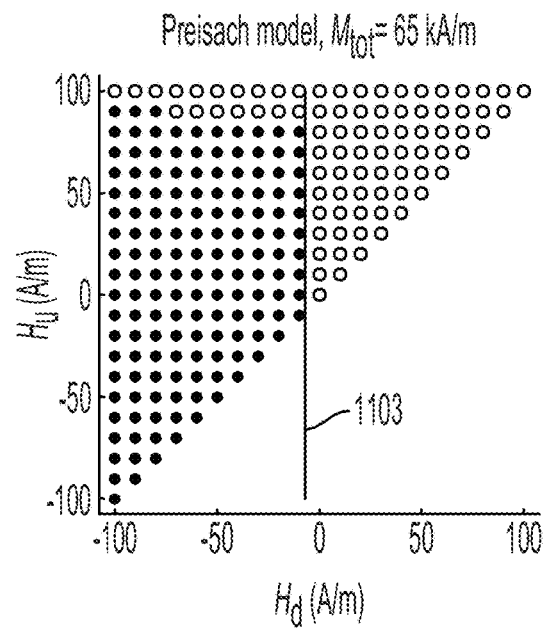
FIG. 11D illustrates application of a Preisach model, in accordance with some embodiments.

The asterisk in FIG. 11C illustrates the current value of the external magnetic field after being switched on some time before and currently decreasing in magnitude. FIG. 11D illustrates the state of the Preisach model at this particular time. As was the case in FIG. 11B, the hysterons polarized upwards are illustrated as filled circles, whereas the empty circles represent hysterons with downwards polarization. The instantaneous external field strength is illustrated in FIG. 11D by the vertical line 1103. As time progresses, the vertical line 1103 moves from the right side of the array of hysterons to the left side. All hysterons to the right of the current level of the vertical line 1103 are in a downward polarization configuration. The hysterons to the left of the current level of the vertical line 1103 remain unchanged relative to the previous state of the Preisach model.

Figure 12:
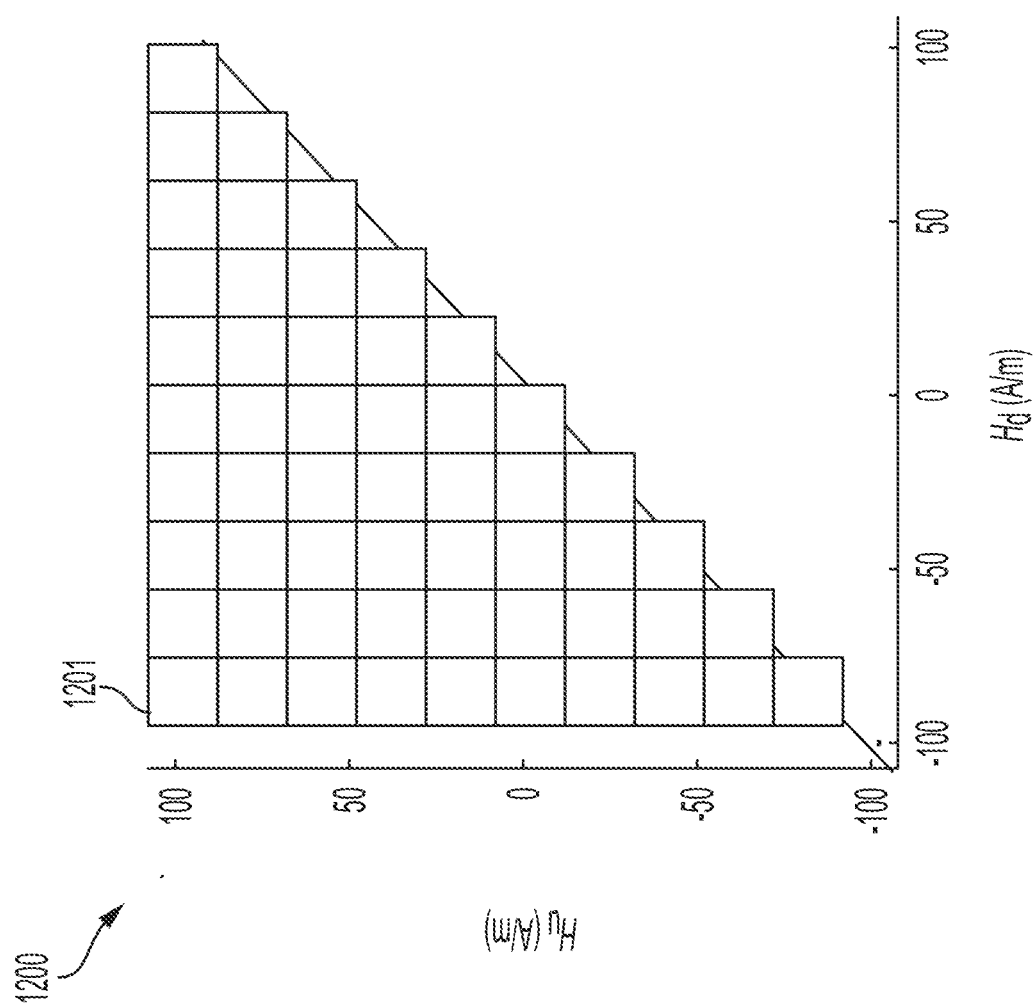
FIG. 12 illustrates a Preisach model of hysteresis effects based on multiple hysteron models, according to some embodiments.

The above description of the Preisach model explains the state of the model and how the state changes as the applied external magnetic field (e.g., from a gradient coil) increases and/or decreases. FIG. 12 illustrates another depiction of the Preisach model 1200 where each of the discrete locations within the $H_d$-$H_u$ plane is represented by a respective box 1201. Each box is associated with a weight that is used to adjust a target pulse sequence to result in a corrected pulse sequence used to control the gradient coil of the MRI system. In some embodiments, an amplitude of a pulse in a gradient pulse sequence is altered based on the state of the Preisach model. For example, if a particular hysteron is determined to be in a downward polarization no adjustment may be made to the amplitude of a pulse of the gradient pulse sequence. But if that same hysteron is determined to be in an upward polarization state, the weight may be added to the amplitude of the pulse, thus changing the amplitude of the pulse based on a particular hysteron only when the state of the hysteron is in one of the two states. Alternatively, the weights may be determined such that when a particular hysteron is determined to be in a downward polarization the weight is subtracted from the amplitude of the pulse in the gradient coil sequence, and if that same hysteron is determined to be in an upward polarization state, the weight may be added to the amplitude of the pulse, thus changing the amplitude of the pulse based on a particular hysteron for both states of the hysteron, but in opposite directions.

Figure 13A:
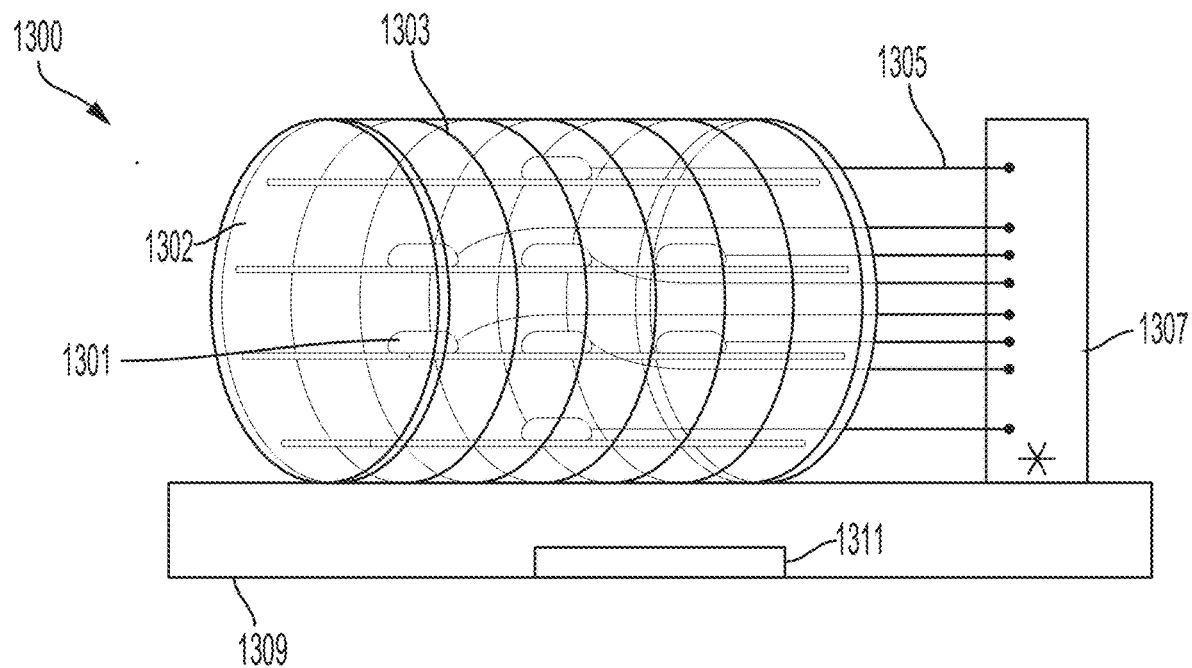
FIG. 13A illustrates a schematic of a multi-element probe, in accordance with some embodiments.

The weights associated with each box 1201 of the Preisach model 1200 may be determined based on measurements of hysteresis effects made in a calibration stage prior to imaging a patient. To measure the induced magnetization of the MRI system, a multi-element probe is placed within the imaging region of the MRI system, each receiving element of the multi-element probe being located at a different position within the imaging region so that the induced gradient field may be measured. The various electromagnets of the MRI system are then controlled by, e.g., controller 701 of FIG. 7, using a pulse sequence comprising a plurality of pulses to generate a dynamic magnetic field that is measured by the field probe to determine the hysteresis effects of the applied magnetic fields FIG. 13A illustrate a multi-element field probe, according to some embodiments. The multi-element field probe 1300 includes a plurality of RF receiving elements 1301a-h, a housing 1302, a RF transmit coil 1303, a plurality of electrical connectors 1305, a control electronics 1307, a base support 1309, a fastener 1311, and a plurality of liquid samples 1321. While the multi-element field probe 1300 is illustrated to have a particular number of components and arrangement of components, it should be appreciated that the illustrated probe is but one example and other arrangements of components may be used. The diameter of the housing 1302 may determine the size of the multi-element field probe 1300 which is may be approximately 12 cm in diameter. The size is selected to be large enough to have a large SNR, but small enough such that inhomogeneity of magnetic fields is reduced.

The multi-element field probe 1300 is positioned inside the MRI system such that multi-element field probe 1300 experiences the various magnetic fields created by the $B_0$ magnet, the gradient coils and the shim coils. The RF transmit coil 1303 is controlled to create an RF pulse that causes precession in the molecules of the liquid samples 1321. The receiving elements 1301 measure the resulting MRI signal from each respective liquid sample 1321 and transmits the signal to control electronics 1307.

Figure 13B:
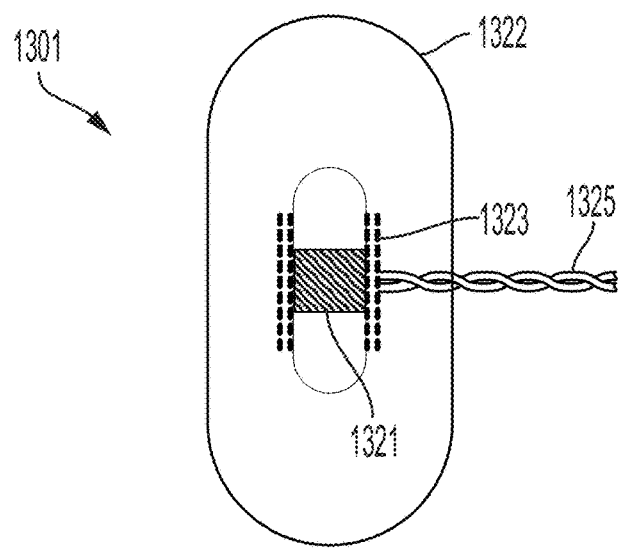
FIG. 13B illustrates a receiving element of a multi-element probe, in accordance with some embodiments.
Figure 13C:
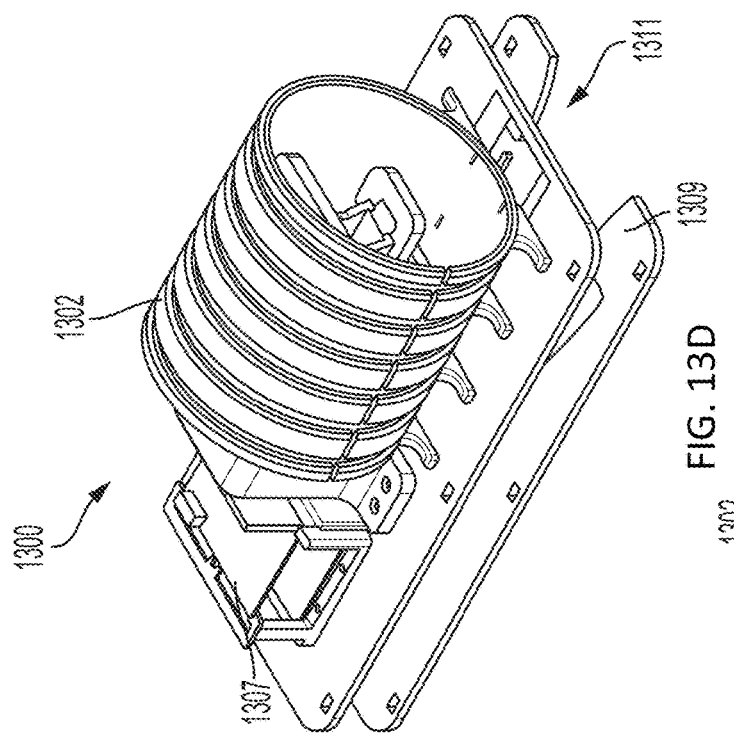
FIG. 13C is a top view of a multi-element probe, in accordance with some embodiments.
Figure 13D:
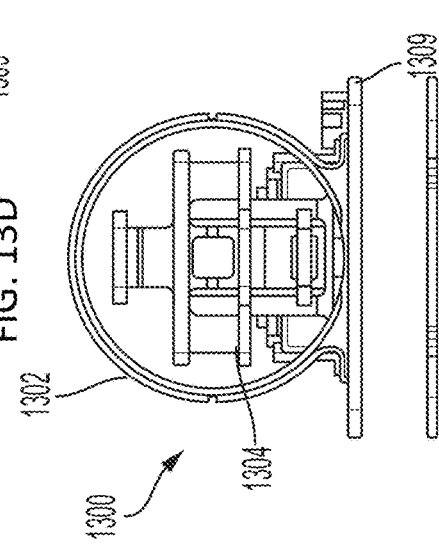
FIG. 13D is a perspective view of a multi-element probe, in accordance with some embodiments.
Figure 13E:
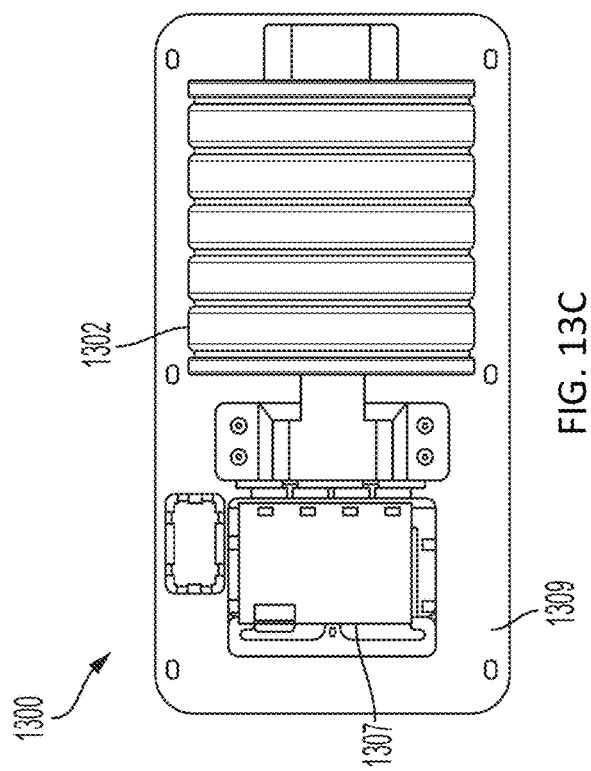
FIG. 13E is a side view of a multi-element probe, in accordance with some embodiments.
Figure 13F:
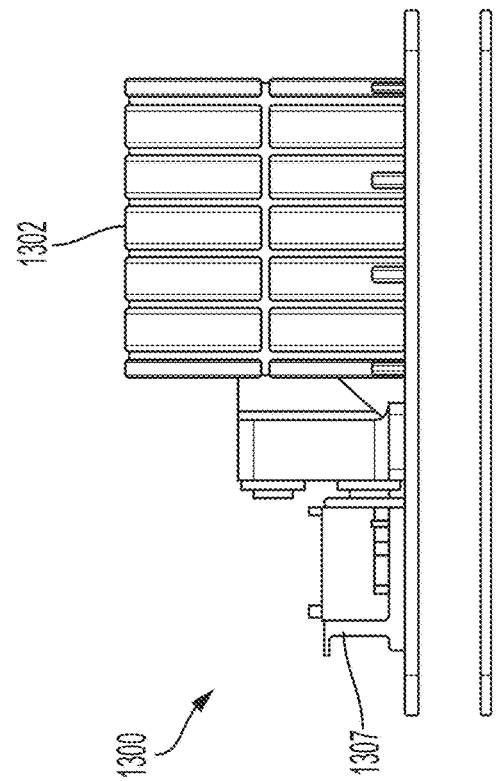
FIG. 13F is an end view of a multi-element probe, in accordance with some embodiments.
Figure 13G:
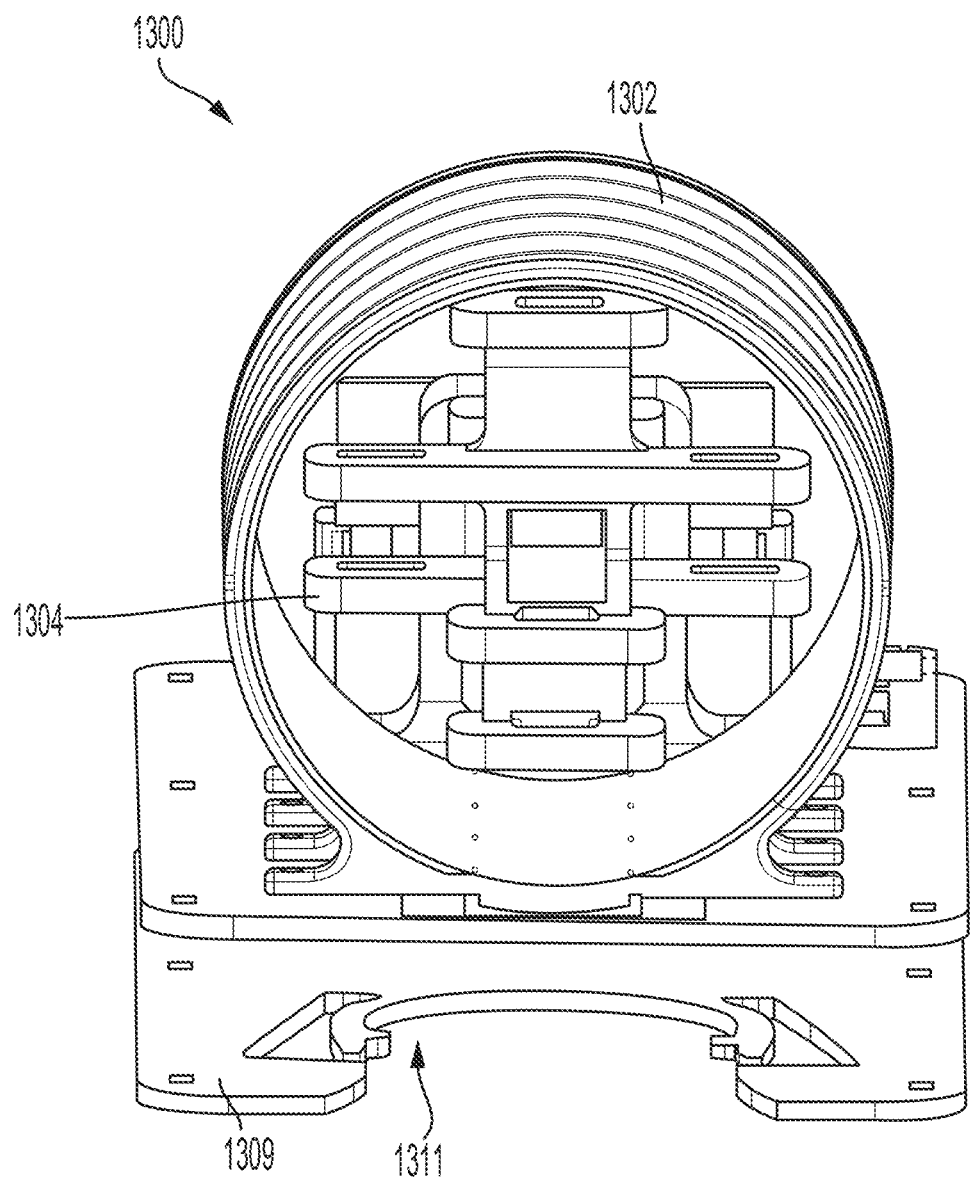
FIG. 13G is a perspective view of a multi-element probe, in accordance with some embodiments.
Figure 13H:
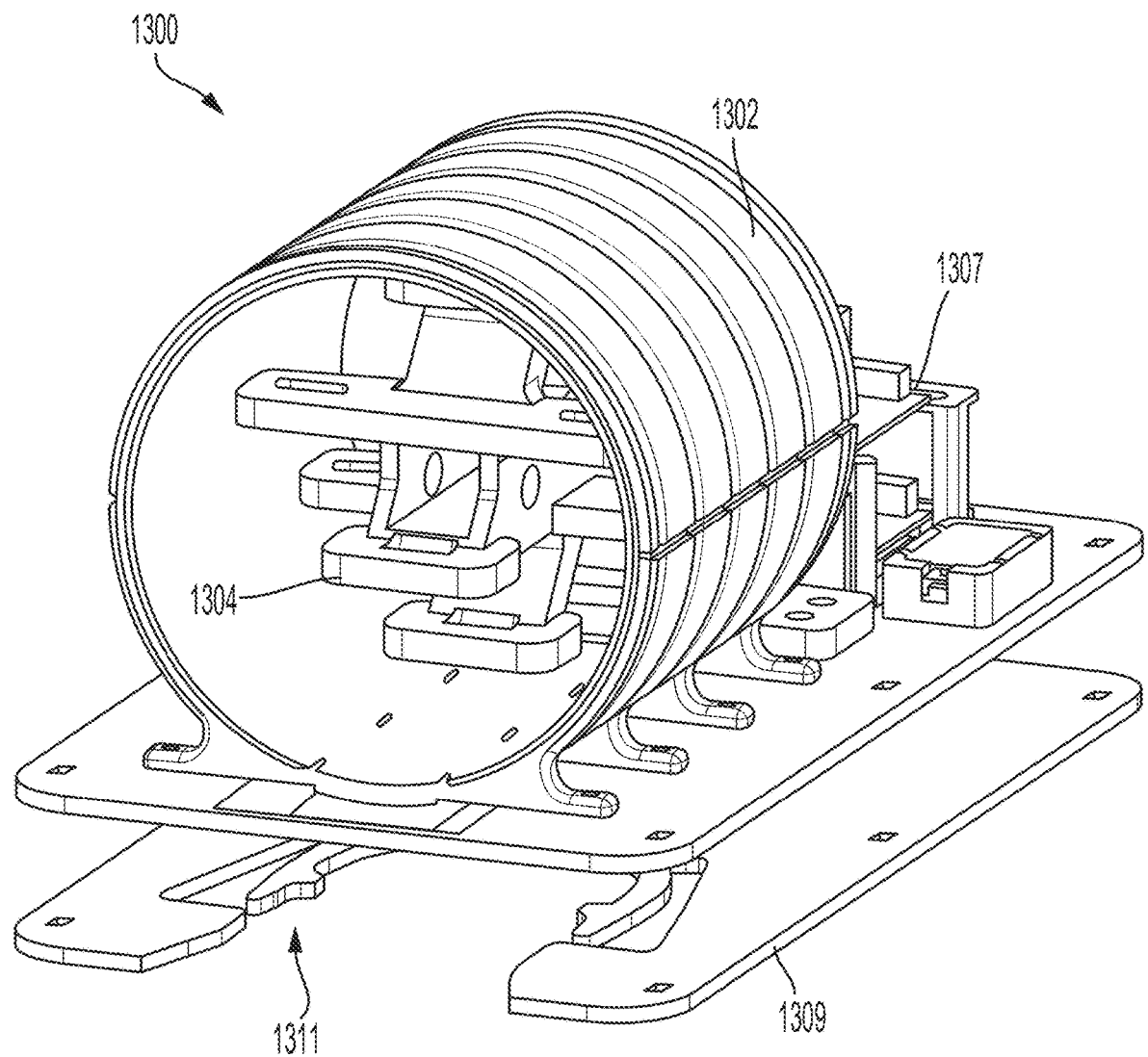
FIG. 13H is a perspective view of a multi-element probe, in accordance with some embodiments.

FIG. 13B illustrates one of the RF receiving elements 1301 from FIG. 13A, according to some embodiments. In some embodiments, each of the RF receiving elements 1301 may include a coil that is wrapped around a corresponding liquid sample 1321. The coil 1323 may be a conductive wire formed from any suitable conductor such as a metal (e.g., copper). In some embodiments, the coil 1323 may include a multilayer Litz solenoid such that the liquid sample 1321 is inside the solenoid. For example, a two-layer Litz solenoid may be used. Each of the RF receiving elements 1301 may also include a twisted pair Litz cable 1325 that electrically connects the RF receiving elements 1301 to the control electronics 1307. The liquid sample 1321 and coil 1323 may further be embedded in a shell of epoxy 1322.

In some embodiments, the RF receiving elements 1301 are positioned within the housing 1302. The RF receiving elements 1301 may be evenly spaced from one another. For example, the position of each RF receiving elements 1301 may correspond to the corners of an imaginary cube. In some embodiments, the RF receiving elements 1301 may be positioned where the corners of an imaginary cube intersect an imaginary sphere in which the cube is inscribed. The imaginary sphere may, for example, have a diameter of approximately 12 cm.

In some embodiments, the liquid samples 1321 may comprise water and/or mineral oil. The liquid samples 1321 may also include agar to set the liquid in place. Alternatively or additionally, the liquid samples 1321 may include copper sulfate to decrease the relaxation time of the liquid samples. In some embodiments, the liquid samples 1321 and the RF receiving elements may be held in position using a support member 1304 made from a non-ferromagnetic material. While the liquid samples 1321 are described throughout this application as being liquid, it should be understood that the liquid samples 1321 may be gel samples, in some embodiments.

In some embodiments, the RF transmit coil 1303 comprises a conductive wire that wraps around the outside or the inside of the housing 1302. The RF transmit coil 1303 may include multiple circular loops that surround the RF receiving elements 1301. In the field probe 1300 illustrated in FIG. 13, the RF transmit coil 1303 includes six circular loops. It should be appreciated that the RF transmit coil 1303 may include more loops or fewer loops.

In some embodiments, the housing 1302 is supported by a base 1309, which is configured to be placed on a surface within the imaging region of the MRI system. The base 1309 may include a fastener 1311 that is configured to position the field probe 1300 at the isocenter of the MRI system. For example, the fastener 1311 may be a particular shape cut into the base 1309 that fits into a correspondingly-shaped fastener located within the MRI system. When the fastener 1311 engages with the fastener of the MRI system, the operator of the MRI system can be confident that the field probe 1300 is located at the isocenter of the MRI system.

Additional views of an example field probe 1300 are illustrated in FIGS. 13C-G. The support member 1304 is more clearly shown in these drawings. In some embodiments, the support member 1304 includes openings for receiving the plurality of RF receiving elements 1301.

Figure 14:
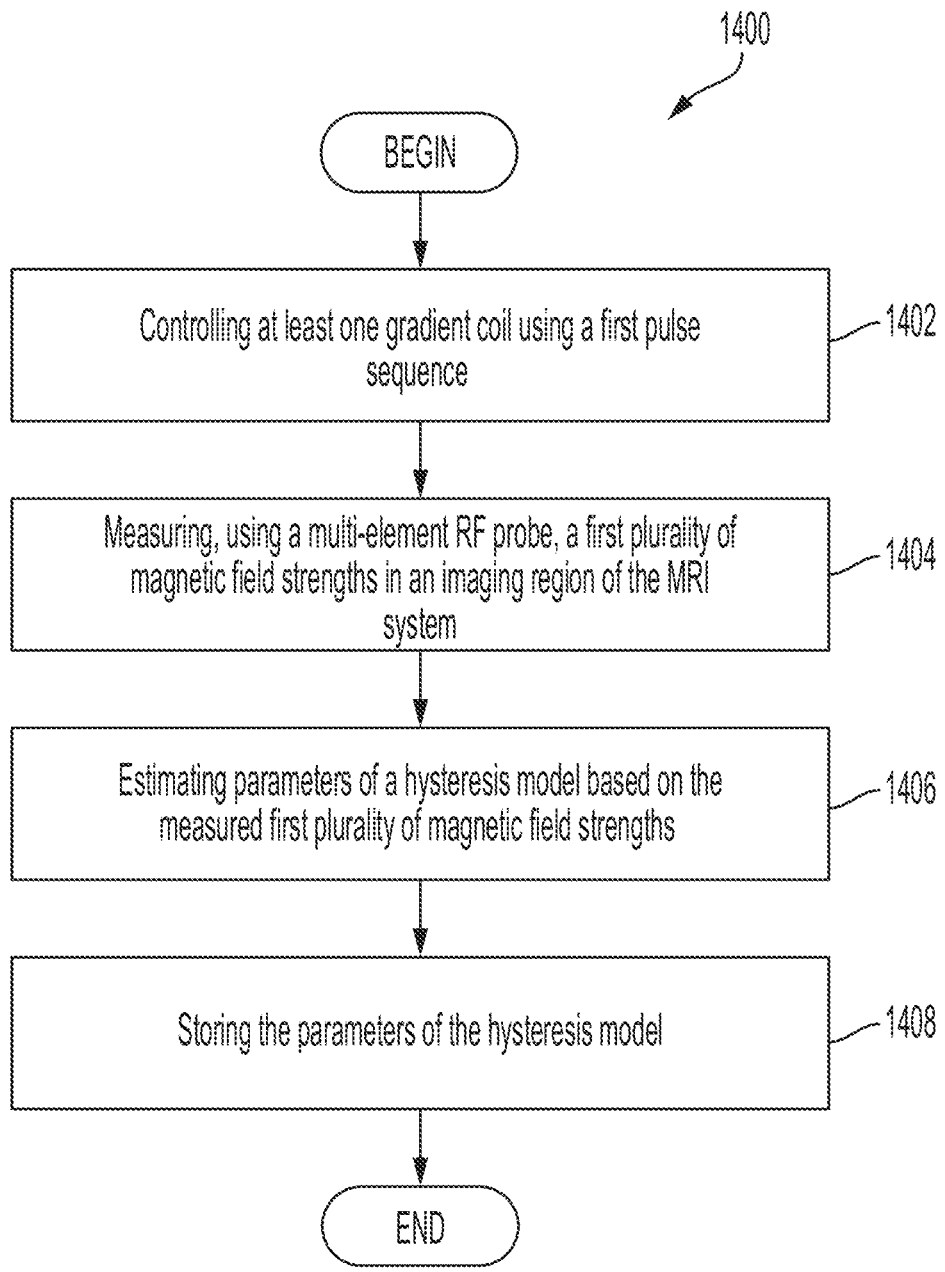
FIG. 14 illustrates a method of measuring hysteresis effects induced in an MRI system, in accordance with some embodiments.

The field probe 1300, once in place in the MRI system, may be used to measure the magnetic field in an imaging region of the MRI system. The measurements of the magnetic field in the MRI system may then be used to determine the weights of the Preisach model 1200 of FIG. 12 FIG. 14 is a flow chart of a method 1400 for measuring hysteresis in an MRI system that includes at least one gradient coil, according to some embodiments.

At act 1402, the method 1400 includes controlling the at least one gradient coil using a first pulse sequence. As discussed above, a controller 106 may use a pulse sequence to control the magnetic field created by gradient coil(s) 128. The first pulse sequence may include a plurality of pulse sequences related to different electromagnets within the MRI system 100. For example, the first pulse sequence may include one or more pulses for controlling the $B_0$ magnet 122, shim coils 124, RF transmit and receive coils 126, and gradient coils 128. The first pulse sequence may be a pulse sequence specifically designed to measure hysteresis effects in the MRI system.

Figure 15B:
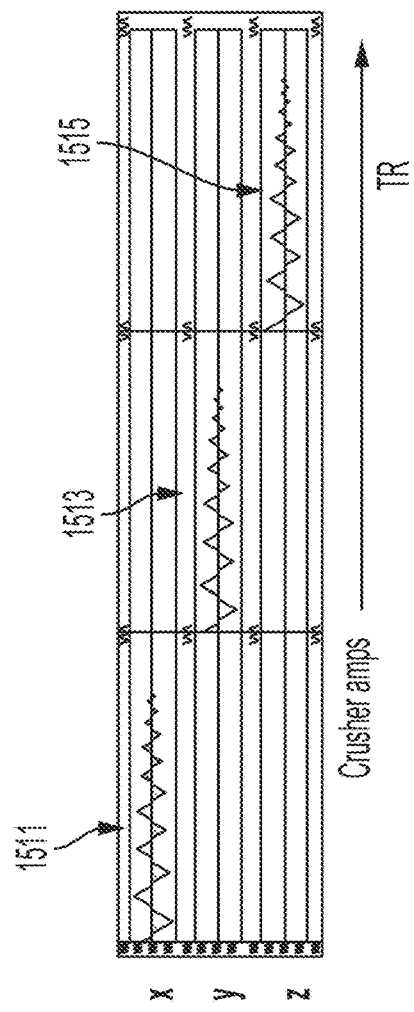
FIG. 15B illustrates example gradient crush amplitude sequences, in accordance with some embodiments.
Figure 15A:
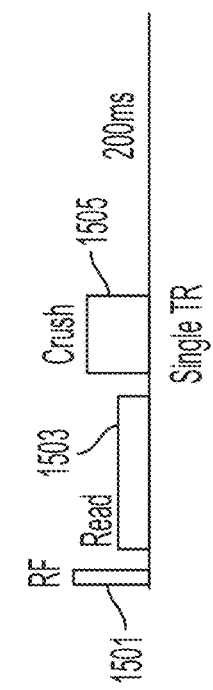
FIG. 15A illustrates a portion of a pulse sequence used to control an MRI system, in accordance with some embodiments.

FIG. 15A illustrates a portion 1500 of an example first pulse sequence used to measure the hysteresis effects of an MRI system, according to some embodiments. The illustrated portion 1500 is the pulse sequence for a single repetition time (TR), which is the time that elapses between two different RF transmit pulses. The portion 1500 of the pulse sequence includes an RF transmit pulse 1501, a read window 1503 and a gradient crush pulse 1505. The read window 1503 is between the RF pulse 1501 and the gradient crush pulse 1505. However, embodiments may include additional pulses as part of the first pulse sequence. For example, the portion 1500 may be repeated multiple times. In some embodiments, the gradient crush pulse 1505 may vary in amplitude after every iteration. One or more parameters used to specify the first pulse sequence may be accessed in a memory by the controller to control the electromagnets. The parameters may include the timing of the pulses, the central frequency of the pulses, the phase of the pulses, and/or the amplitude of the pulses.

FIG. 15B illustrates an example gradient crush amplitude sequence 1550, according to some embodiments. The gradient crush amplitude sequence provides the amplitude for the gradient crush pulse 1505 for each subsequent iteration of the portion 1500 of the pulse sequence. It is noted that every gradient crush pulse is associated with an RF transmit pulse 1501 and a read window 1503, even though FIG. 15B only shows the amplitude of the gradient crush pulses.

In some embodiments, where an x-gradient coil, a y-gradient coil and a z-gradient coil are used, there are three independent portions of the gradient crush amplitude sequence 1550. For example, first only x-gradient crush pulses are used, followed by y-gradient crush pulses, and finally followed by z-gradient crush pulses. It should be appreciated that the order may be different in some embodiments, but crush pulses are only used to control one gradient coil at a time until the entire gradient pulse sequence for each gradient coil is complete, then the pulse sequence continues with the next gradient coil. In the example illustrated in FIG. 15B, first the x-gradient coil is controlled by a sequence 1511 of pulses with varying amplitude, oscillating between a maximum and minimum amplitude that decays until the amplitude is negligible. After the x-gradient pulse sequence is complete, the y-gradient pulse sequence begins with a sequence 1513 of pulses with varying amplitude, oscillating between a maximum and minimum amplitude that decays until the amplitude is negligible. Finally, after the y-gradient pulse sequence is complete, the z-gradient pulse sequence 1515 begins with a sequence of pulses with varying amplitude, oscillating between a maximum and minimum amplitude that decays until the amplitude is negligible. Thus, as shown in FIG. 15B, there are portions of each gradient pulse sequence where the amplitude of the gradient crush pulse is monotonically increasing and portions where the amplitude of the gradient crush pulse is monotonically decreasing.

Returning to FIG. 14, the method 1400 continues at act 1604 which includes measuring, using the multi-element RF probe, a first plurality of magnetic field strengths in an imaging region of the MRI system. In some embodiments, act 1604 may be performed at the same time as act 1604. For example, each RF transmit pulse 1501 is associated with a read window 1503 during which the measurement of the magnetic field strength occurs. Thus, the measuring occurs during the controlling of the gradient coil using the pulse sequence. However, in some embodiments, both the RF transmit coil and the gradient coil are not "on" while the measurement of the magnetic field strengths is performed. In this way, the induced magnetic field is measured without the presence of the magnetic field generated by the gradient coil.

Figure 16:
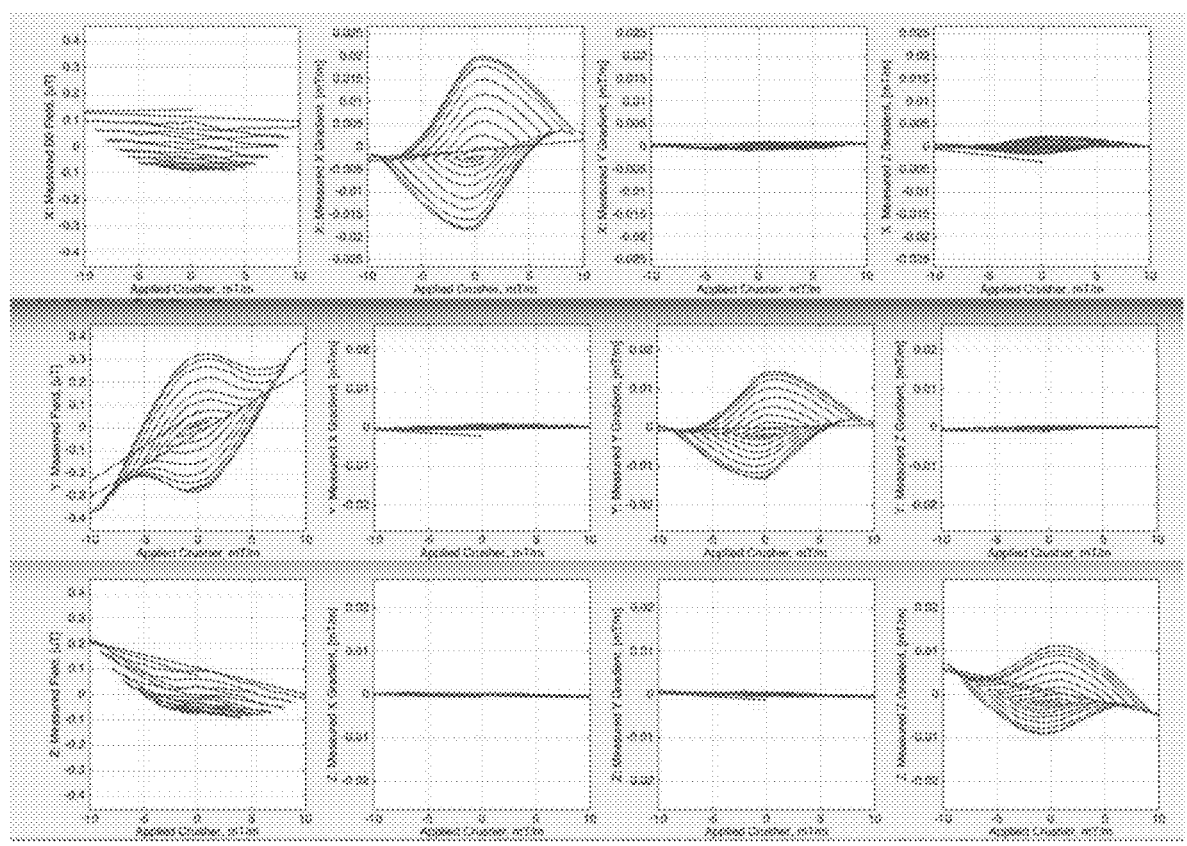
FIG. 16 illustrates measured constant and gradient magnetic field hysteresis effects, according to some embodiments.
Figure 17C:
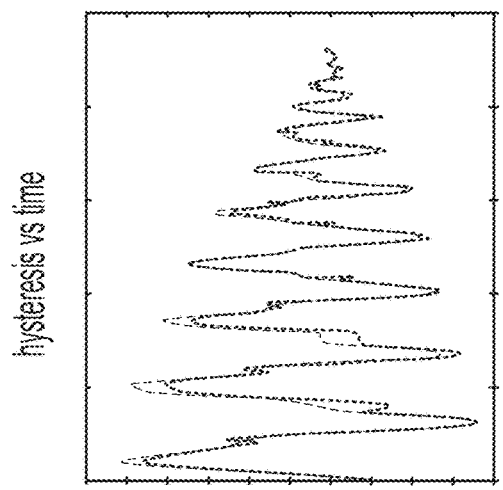
FIG. 17C illustrates a hysteresis versus time curve, in accordance with some embodiments.
Figure 17B:
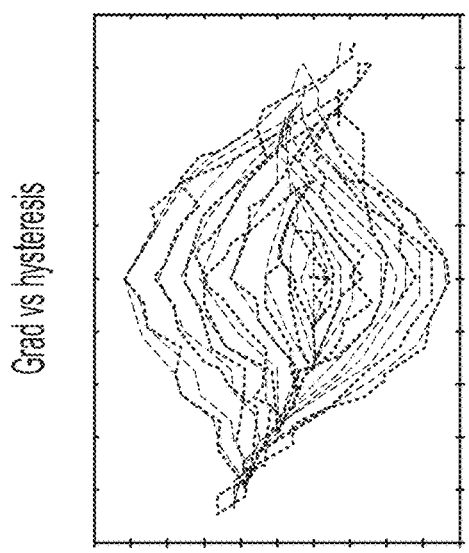
FIG. 17B illustrates a hysteresis versus gradient curve, in accordance with some embodiments.

After measuring the magnetic field strengths, a computer hardware processor is used to extract the phase from each element in the field probe and separate the phase into linear spatial terms (e.g., x, y, z gradients terms) and constant field terms (e.g., $B_0$ terms). FIG. 16 shows the hysteresis effects for each separate part of the extracted phase for each axis of the MRI system. The plots in the top row correspond to the measured hysteresis effects when the x-gradient coil is controlled by the gradient pulse sequence described above; the plots in the middle row correspond to the measured hysteresis effects when the y-gradient coil is controlled by the gradient pulse sequence described above; and the plots in the bottom row correspond to the measured hysteresis effects when the x-gradient coil is controlled by the gradient pulse sequence described above. The plots in the first column represents the constant $B_0$ terms for each of the axes; the plots in the second column represents the linear term along the x-axis; the plots in the third column represents the linear term along the y-axis; and the plots in the fourth column represents the linear term along the z-axis. As can be seen, for the linear terms, significant hysteresis effects only exist along the axis corresponding to the gradient coil used. For example, in the top row, corresponding to hysteresis resulting from driving the x-gradient coil, significant hysteresis in the linear terms is only found along the x-axis. Similarly, in the middle row, corresponding to hysteresis resulting from driving the y-gradient coil, significant hysteresis in the linear terms is only found along the y-axis. Similarly, in the bottom row, corresponding to hysteresis resulting from driving the z-gradient coil, significant hysteresis in the linear terms is only found along the z-axis.

From the data shown in FIG. 16, it can be seen that hysteresis effects in the linear terms only need to be corrected for the direction associated with the gradient coil. In other words, when adjusting the amplitudes of a target gradient pulse sequence for a particular direction to determine a corrected gradient pulse sequence for that particular direction, the controller takes into account the target gradient pulse sequence for that particular direction and does not base the corrected gradient pulse sequence on the target gradient pulse sequence for the other directions. Accordingly, in some embodiments there is a separate independent hysteresis model (e.g., a Preisach model) for each of the three directions.

As can also be seen from the plots in FIG. 16, the constant $B_0$ terms only exhibit hysteresis along the y-axis. This is because, in the example MRI system used for this data, the $B_0$ field is oriented along the y-axis. Consequently, since the y-gradient coil induces magnetization along the y-axis, the induced magnetization effects not only the linear y-terms, but also the constant $B_0$ terms. The x-gradient coils and the z-gradient coils do not cause hysteresis effects in the $B_0$ terms. However, it should be appreciated that other MRI systems may have the $B_0$ field oriented in a different direction, in which case other directions may experience hysteresis in the constant $B_0$ terms.

Figure 17A:
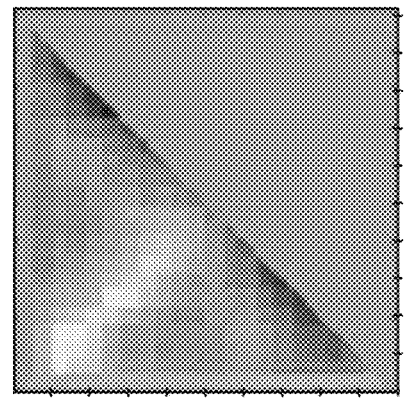
FIG. 17A illustrates a Preisach model of hysteresis effects with fitted weights, in accordance with some embodiments.

At act 1406, the method 1400 includes estimating parameters of a hysteresis model based on the measured first plurality of magnetic field strengths. Act 1406 is performed after act 1402 and act 1404. FIG. 17A illustrates an example of the weights of a Preisach model resulting from the iteratively fitting the measured power measurements of hysteresis as a function of gradient crush pulse amplitude of FIG. 17B and the hysteresis as a function of time of FIG. 17C. The weights of the Preisach model are determined iteratively by initializing the weights to an initial value. As the gradient crush pulse amplitude increases, the columns of the Preisach model are set by, for example, taking a simple difference between the measured magnetic field strength and the initialized weight. Then, as the gradient crush pulse amplitude is decreased, the rows of the Preisach model are set in a similar way, e.g., by taking a simple difference between the measured magnetic field strength and the initialized weight. After an initial loop through the Preisach model, the weights have now been updated to be different from the initialized value. The same process may be executed again for a second loop to further update the weights. This process may be iterated until the weights of the Preisach model stop changing by a threshold amount. Alternatively, the algorithm for estimating the weights can run a set number of loops.

As mentioned above, there may be a Preisach model for each of the x-, y-, and z-directions. Accordingly, the same iterative fitting procedure may be performed for each of the three directions.

At act 1408, the method 1400 includes storing the parameters of the hysteresis model in memory. The parameters may include the weights of the Preisach model associate with the x-direction, the weights of the Preisach model associate with the y-direction, and the weights of the Preisach model associate with the z-direction. In some embodiments, the lower magnetic field strength value and the upper magnetic field strength value associated with each weight (e.g., see the hysterons of FIGS. 10A-B) may be stored in a memory with the weights.

Figure 18:
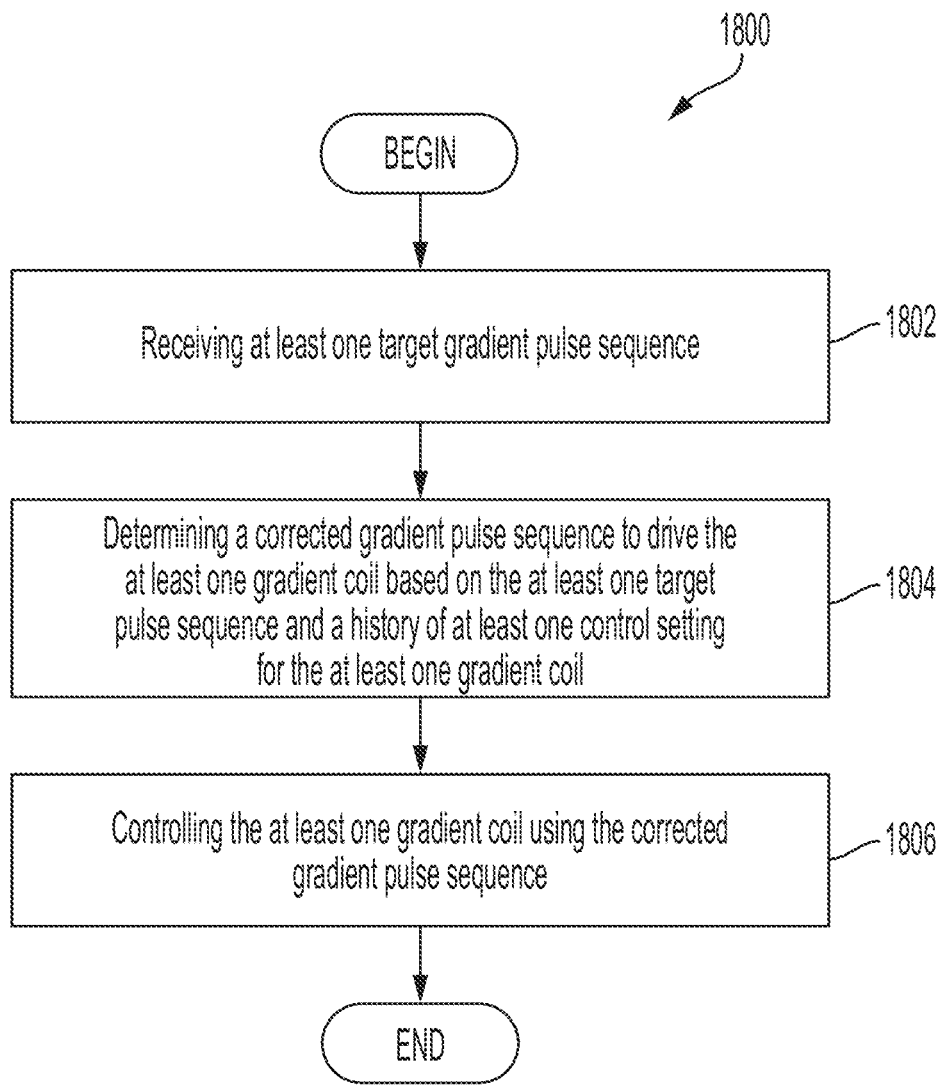
FIG. 18 illustrates a method of controlling at least one gradient coil of a magnetic resonance imaging (MRI) system, in accordance with some embodiments.

After measuring the hysteresis effects and storing the parameters of the hysteresis model in memory, the hysteresis model may be used to determine a corrected pulse sequence from a target pulse sequence so as to reduce the errors created from the induced magnetization of the MRI system. FIG. 18 is a flowchart of a method 1800 for controlling at least one gradient coil of a MRI system.

At act 1802, the method 1800 include receiving at least one target pulse sequence. In some embodiments, the target pulse sequence may be received by the controller 106 from pulse sequence repository 108 or any other suitable storage device. The target pulse sequence may include a plurality of pulses for controlling the various electromagnets of the MRI system. For example, it may include pulses for controlling the RF transmit and receive coils 126 and/or gradient coils 128. Thus, the target pulse sequence may include a number of sub-sequences, such as: a x-gradient pulse sequence that is the pulse sequence for controlling only the x-gradient coil, a y-gradient pulse sequence that is the pulse sequence for controlling only the y-gradient coil, a z-gradient pulse sequence that is the pulse sequence for controlling only the z-gradient coil, a RF transmit pulse sequence that is the pulse sequence for controlling the RF transmit coil, and a RF receive pulse sequence that is the pulse sequence for controlling the RF receive coil.

At act 1804, the method 1800 includes determining a corrected pulse sequence to control the at least one gradient coil based on the at least one target pulse sequence and a hysteresis model of induced magnetization in the MRI system caused by operation of the at least one gradient coil. In some embodiments, the hysteresis model has a "state" based on the history of the gradient pulse sequence and the corrected pulse sequence is based on that state. For example, the hysteresis model may include one or more Preisach models, as described above. In some embodiments, the hysteresis model includes multiple different parameters, at least a subset of which are determined from a previously-obtained hysteresis measurement obtained with a multi-element probe.

In some embodiments, determining the corrected pulse sequence starts at the beginning of the pulse sequence and iterates through the plurality of pulses. For example, a gradient pulse sequence may include multiple target gradient pulses. The amplitudes of each of the target gradient pulses may be adjusted to determine the corrected gradient pulse sequence. The adjustment to any given gradient pulse may be based on at least the amplitude of a previous gradient pulse within the gradient pulse sequence.

After iterating through all the pulses of the pulse sequence, the process may be iterated for the entire pulse sequence at least one more time. The result of the previous iteration is used as the input for each subsequent iteration. For example, the algorithm may be executed a first time using the target pulse sequence as the input. The result of the first iteration is a first corrected pulse sequence. The first corrected pulse sequence may then be used as the starting point of a second iteration where a second corrected pulse sequence is determined using the first corrected pulse sequence and the hysteresis model. Embodiments may be iterative because corrections made to amplitudes of particular pulses in the pulse sequence in a first iteration may affect the amplitudes of previous pulses in the pulse sequence in a way that could not be adjusted in the first iteration. Thus, at least a second iteration can help determine a more accurate corrected pulse sequence. Any number of iterations may be used. However, as the corrections due to hysteresis is relatively small, some embodiments only include two iterations.

In some embodiments, the determining the corrected pulse sequence may include adding one or more weights from a Preisach model to the amplitude of one or more gradient pulses of a gradient pulse sequence. Which weights are added to the amplitudes of each pulse of the target gradient pulse sequence depends on the state of the Preisach model, as described above.

In some embodiments, determining the corrected pulse sequence may include adjusting the central frequency or phase of a RF transmit pulse and/or the central frequency or phase of a RF receive pulse. This is because, as discussed above, the hysteresis caused by certain gradient coils can affect the strength of the $B_0$ field. When the strength of the $B_0$ field changes, the precession frequency of the atoms in the patient change. Thus, the central frequency and/or phase of the RF transmit pulse and/or RF transmit pulse is adjusted to match the altered precession frequency due to the changes in the $B_0$ field.

At act 1806, the method 1800 includes controlling, using the corrected pulse sequence, the at least one gradient coil to generate one or more gradient pulses for imaging a patient.

Figure 19B:
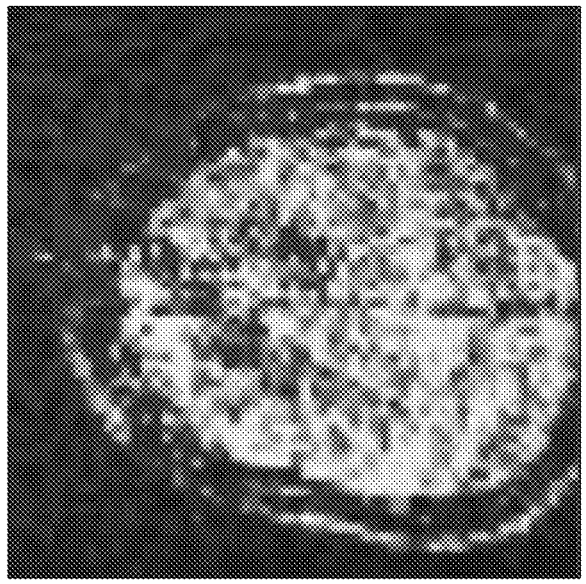
FIG. 19B illustrates an example MRI image resulting from an MRI system that corrects for hysteresis effects, in accordance with some embodiments.
Figure 19A:
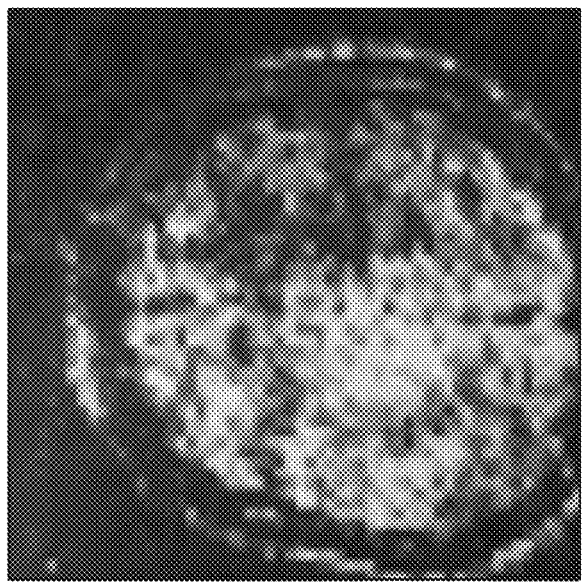
FIG. 19A illustrates an example MRI image resulting from an MRI system without correcting for hysteresis effects.

FIG. 19A-B illustrate the improvement in SNR that results from correcting for hysteresis effects as described in this disclosure. FIG. 19A is an MRI image of a patient resulting from imaging that does not correct for hysteresis effects by using corrected pulses sequences. FIG. 19B is an MRI image of the same patient resulting from imaging that corrects for hysteresis effects by using corrected pulses sequences. A 15% increase in SNR is observed, resulting in better MRI images that may be used for clinical diagnosis.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as a controller that controls the above-discussed function. A controller can be implemented in numerous ways, such as with dedicated hardware, or with general purpose hardware (e.g., one or more processor) that is programmed using microcode or software to perform the functions recited above, and may be implemented in a combination of ways when the controller corresponds to multiple components of a system.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. An apparatus for controlling at least one gradient coil of a magnetic resonance imaging (MRI) system, the apparatus comprising:
   at least one computer hardware processor; and
   at least one computer-readable storage medium storing processor executable instructions that, when executed by the at least one computer hardware processor, cause the at least one computer hardware processor to perform a method comprising:
      receiving information specifying at least one target pulse sequence;
      determining a corrected pulse sequence to control the at least one gradient coil based on the at least one target pulse sequence and a hysteresis model of induced magnetization in the MM system caused by operation of the at least one gradient coil, wherein the hysteresis model comprises a plurality of weights, and wherein determining the corrected pulse sequence comprises:
         using the hysteresis model to determine a first adjusted pulse amplitude of a first corrected pulse within the corrected pulse sequence based on a measure of the induced magnetization in the MRI system caused by operation of the at least one gradient coil, wherein determining the first adjusted pulse amplitude of the first corrected pulse is based on the hysteresis model and a value of at least a second adjusted pulse amplitude of a second corrected pulse that occurs earlier in the corrected pulse sequence than the first corrected pulse, wherein the plurality of weights are used to adjust the at least one target pulse sequence to result in the corrected pulse sequence, and wherein the hysteresis model is based on the measure of the induced magnetization obtained before receiving the information specifying the at least one target pulse sequence; and
      controlling, using the corrected pulse sequence, the at least one gradient coil to generate one or more gradient pulses for imaging a patient.

2. The apparatus of claim 1, wherein the corrected pulse sequence includes a corrected gradient pulse sequence and controlling the at least one gradient coil comprises driving the at least one gradient coil with the corrected gradient pulse sequence such that a strength of a gradient field formed in at least a portion of an imaging region of the MRI system is a target magnetic field strength that the target pulse sequence is designed to achieve.

3. The apparatus of claim 1, wherein determining the corrected pulse sequence is further based on a current state of the hysteresis model.

4. The apparatus of claim 1, wherein the hysteresis model comprises a plurality of lower magnetic field strength values and a plurality of upper magnetic field strength values, wherein each of the plurality of weights is associated with a respective one of the plurality of lower magnetic field strength values and a respective one of the upper magnetic field strength values.

5. The apparatus of claim 1, wherein the hysteresis model comprises a Preisach model.

6. The apparatus of claim 1, wherein each of the plurality of weights is determined using at least one previously-obtained hysteresis measurement obtained with a multielement probe.

7. The apparatus of claim 1, wherein the MRI system includes a ferromagnetic yoke, and wherein the hysteresis model represents effects of hysteresis induced at least in the ferromagnetic yoke by operation of the at least one gradient coil.

8. The apparatus of claim 1, wherein determining the corrected pulse sequence comprises iteratively determining the corrected pulse sequence.

9. The apparatus of claim 8, wherein iteratively determining the corrected pulse sequence comprises:
   determining an initial corrected pulse sequence based on the target pulse sequence and the hysteresis model; and
   determining a final corrected pulse sequence based on the initial corrected pulse sequence and the hysteresis model,
   wherein controlling the at least one gradient coil comprises driving the at least one gradient coil with a final gradient pulse sequence of the final corrected pulse sequence such that a strength of a gradient field formed in at least a portion of an imaging region of the MM system is a target magnetic field strength value.

10. The apparatus of claim 1, wherein the corrected pulse sequence comprises a corrected gradient pulse sequence and determining the corrected gradient pulse sequence comprises determining an amplitude of every pulse of the corrected gradient pulse sequence by iterating from a beginning gradient pulse of the corrected gradient pulse sequence to a final gradient pulse of the corrected gradient pulse sequence, wherein the amplitude of a particular corrected gradient pulse of the corrected gradient pulse sequence is based on at least one previous corrected gradient pulse of the corrected gradient pulse sequence.

11. The apparatus of claim 1, wherein determining the corrected pulse sequence comprises determining a corrected transmit radio frequency (RF) pulse sequence used to control a RF transmit coil and/or a corrected receive RF pulse sequence used to control a RF receive coil.

12. The apparatus of claim 11, wherein:
   determining a corrected transmit RF pulse sequence comprises adjusting a center frequency or phase of a transmit RF pulse of the corrected transmit RF pulse sequence.

13. The apparatus of claim 1, further comprising the MRI system.

14. The apparatus of claim 13, further comprising the at least one gradient coil.

15. The apparatus of claim 13, wherein the Mill system comprises a ferromagnetic yoke.

16. The apparatus of claim 15, wherein the ferromagnetic yoke comprises:
   a first plate comprising ferromagnetic material;
   a second plate comprising ferromagnetic material; and
   a frame comprising ferromagnetic material coupled to the first plate and the second plate.

17. A method of controlling at least one gradient coil of a magnetic resonance imaging (MRI) system, the method comprising, with at least one computer hardware processor:
   receiving information specifying at least one target pulse sequence;
   determining a corrected pulse sequence to control the at least one gradient coil based on the at least one target pulse sequence and a hysteresis model of induced magnetization in the MRI system caused by operation of the at least one gradient coil, wherein the hysteresis model comprises a plurality of weights, and wherein determining the corrected pulse sequence comprises:
  using the hysteresis model to determine a first adjusted pulse amplitude of a first corrected pulse within the corrected pulse sequence based on a measure of the induced magnetization in the MM system caused by operation of the at least one gradient coil, wherein determining the first adjusted pulse amplitude of the first corrected pulse is based on the hysteresis model and a value of at least a second adjusted pulse amplitude of a second corrected pulse that occurs earlier in the corrected pulse sequence than the first corrected pulse, wherein the plurality of weights are used to adjust the at least one target pulse sequence to result in the corrected pulse sequence, and wherein the hysteresis model is based on the measure of the induced magnetization obtained before receiving the information specifying the at least one target pulse sequence; and
  controlling, using the corrected pulse sequence, the at least one gradient coil to generate one or more gradient pulses for imaging a patient.

18. At least one non-transitory computer-readable storage medium storing processor executable instructions that, when executed by at least one computer hardware processor, cause the at least one computer hardware processor to perform a method of controlling at least one gradient coil of a magnetic resonance imaging (MRI) system, the method comprising:
  receiving information specifying at least one target pulse sequence;
  determining a corrected pulse sequence to control the at least one gradient coil based on the at least one target pulse sequence and a hysteresis model of induced magnetization in the MRI system caused by operation of the at least one gradient coil, wherein the hysteresis model comprises a plurality of weights, and wherein determining the corrected pulse sequence comprises:
    using the hysteresis model to determine a first adjusted pulse amplitude of a first corrected pulse within the corrected pulse sequence based on a measure of the induced magnetization in the MM system caused by operation of the at least one gradient coil, wherein determining the first adjusted pulse amplitude of the first corrected pulse is based on the hysteresis model and a value of at least a second adjusted pulse amplitude of a second corrected pulse that occurs earlier in the corrected pulse sequence than the first corrected pulse, wherein the plurality of weights are used to adjust the at least one target pulse sequence to result in the corrected pulse sequence, and wherein the hysteresis model is based on the measure of the induced magnetization obtained before receiving the information specifying the at least one target pulse sequence; and
  controlling, using the corrected pulse sequence, the at least one gradient coil to generate one or more gradient pulses for imaging a patient.

* * * * *

UNITED STATES PATENT AND TRADEMARK OFFICE
CERTIFICATE OF CORRECTION

PATENT NO. : 11,867,787 B2
APPLICATION NO. : 16/684976
DATED : January 9, 2024
INVENTOR(S) : Rafael O'Halloran et al.

Page 1 of 1

It is certified that error appears in the above-identified patent and that said Letters Patent is hereby corrected as shown below:

In the Claims

Claim 1, Column 37, Line 24: replace "MM system" with --MRI system--
Claim 9, Column 38, Line 26: replace "MM system" with --MRI system--
Claim 15, Column 38, Line 53: replace "Mill system" with --MRI system--
Claim 17, Column 39, Line 9: replace "MM system" with --MRI system--
Claim 18, Column 40, Line 13: replace "MM system" with --MRI system--

Signed and Sealed this
Twenty-fourth Day of June, 2025

Coke Morgan Stewart
*Acting Director of the United States Patent and Trademark Office*